(12) United States Patent
Yosui et al.

(10) Patent No.: US 10,079,615 B2
(45) Date of Patent: Sep. 18, 2018

(54) MULTILAYER BODY AND COMMUNICATION APPARATUS

(71) Applicant: Murata Manufacturing Co., Ltd., Nagaokakyo-shi, Kyoto-fu (JP)

(72) Inventors: Kuniaki Yosui, Nagaokakyo (JP); Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/862,688

(22) Filed: Jan. 5, 2018

(65) Prior Publication Data

US 2018/0145710 A1    May 24, 2018

Related U.S. Application Data

(63) Continuation of application No. 15/255,201, filed on Sep. 2, 2016, now Pat. No. 9,900,034, which is a
(Continued)

(30) Foreign Application Priority Data

Aug. 10, 2012  (JP) ................................ 2012-178020
Sep. 12, 2012  (JP) ................................ 2012-200284

(51) Int. Cl.
*H04B 1/10* (2006.01)
*H04B 1/16* (2006.01)
(Continued)

(52) U.S. Cl.
CPC ............. *H04B 1/126* (2013.01); *H03H 7/463* (2013.01); *H04B 1/12* (2013.01); *H04B 1/16* (2013.01); *H04B 1/525* (2013.01); *H04W 84/042* (2013.01)

(58) Field of Classification Search
CPC ....... H04H 7/46; H01P 1/2136; H04B 1/1036; H04B 1/1063
(Continued)

(56) References Cited

U.S. PATENT DOCUMENTS 5,097,236 A    3/1992  Wakino et al.
9,467,184 B2 * 10/2016  Yosui ..................... H03H 7/463
(Continued)

FOREIGN PATENT DOCUMENTS

JP    03-72701 A    3/1991
JP    08-335804 A    12/1996
(Continued)

OTHER PUBLICATIONS

Official Communication issued in corresponding Chinese Patent Application No. 201610605696.X, dated Apr. 2, 2018.
(Continued)

*Primary Examiner* — Lee Nguyen
(74) *Attorney, Agent, or Firm* — Keating & Bennett, LLP

(57) ABSTRACT

A branch circuit includes a common antenna port and separates a first communication signal including a signal in a low band and a signal in a high band and a second communication signal that is a signal in a frequency band between the low band and the high band. The branch circuit includes a first-communication-signal-line-side band elimination filter and a second-communication-signal-line-side band elimination filter and SAW filter.

16 Claims, 34 Drawing Sheets

Related U.S. Application Data continuation of application No. 14/565,766, filed on Dec. 10, 2014, now Pat. No. 9,467,184, which is a continuation of application No. PCT/JP2013/070843, filed on Aug. 1, 2013.

(51) Int. Cl.
*H04B 1/12* (2006.01)
*H03H 7/46* (2006.01)
*H04B 1/525* (2015.01)
*H04W 84/04* (2009.01)

(58) Field of Classification Search
USPC .......................................................... 455/306
See application file for complete search history.

(56) References Cited

U.S. PATENT DOCUMENTS 9,900,034 B2 * 2/2018 Yosui ..................... H03H 7/463
2013/0127560 A1 5/2013 Kato et al.

FOREIGN PATENT DOCUMENTS

| | | |
|---|---|---|
| JP | 2005-184773 A | 7/2005 |
| JP | 2007-124310 A | 5/2007 |
| WO | 2012/074100 A1 | 6/2012 |

OTHER PUBLICATIONS

Yosui et al., "Branch Circuit and Branch Cable", U.S. Appl. No. 15/255,201, filed Sep. 2, 2016.

* cited by examiner

Frequency (700MHz to 2.7GHz)

Frequency (700MHz to 2.7GHz)

PRIOR ART

SAW FILTER

PRIOR ART

PRIOR ART

MULTILAYER BODY AND COMMUNICATION APPARATUS

BACKGROUND OF THE INVENTION

1. Field of the Invention

The present invention relates to a branch circuit configured to separate communication signals in a plurality of frequency bands and to a branch cable including the branch circuit.

2. Description of the Related Art

In recent years, mobile communication terminal apparatuses, such as cellular phone terminals, need to have a communication function of utilizing many frequency bands, and at the same time, a reduction in the size of the apparatuses is required. Hence, it is difficult to provide many antenna devices for respective frequency bands, and it becomes important to share an antenna and provide a branch circuit for branching antenna signals to a plurality of communication circuits.

Japanese Unexamined Patent Application Publication No. 2005-184773 discloses a branch circuit for switching among three transmission/reception systems: Cellular, GPS, and PCS. FIG. 25 is a circuit diagram of a branch circuit disclosed in Japanese Unexamined Patent Application Publication No. 2005-184773. This branch circuit supports three bands. The three communication systems are a Cellular communication system (first frequency band: 800 MHz), a GPS communication system (second frequency band: 1500 MHz), and a PCS communication system (third frequency band: 1900 MHz). This signal separation circuit includes an ANT terminal connected to an antenna, a first terminal 1 for input/output of transmission/reception signals in the first frequency band, a second terminal 2 for input of reception signals in the second frequency band, and a third terminal 3 for input/output of transmission/reception signals in the third frequency band. A low pass filter LPF 5 is connected between the ANT terminal and the first terminal 1. A phase adjustment circuit 6 and a SAW filter 7 are connected between the ANT terminal and the second terminal 2. A high pass filter (HPF) 8 and a phase adjustment inductor 9 are connected between the ANT terminal and the third terminal 3.

In FIG. 25, the LPF 5 allows signals in the frequency band of the Cellular communication system to pass therethrough and attenuates signals in the GPS communication system and the PCS communication system. The phase adjustment circuit 6 is provided to increase the respective impedances in the first frequency band and the third frequency band between the ANT terminal and the second terminal 2.

In a mobile terminal including a communication circuit for performing voice communication and data communication and a GPS reception circuit, there is a case in which an RF circuit is configured in such a manner as to supply a GPS signal to the GPS reception circuit and supply communication signals for voice communication and data communication to a single communication circuit. In such a configuration, it becomes necessary to separate the antenna signals into a GPS reception signal and communication signals. In this case, the communication signals include a high-band communication signal and a low-band communication signal and the GPS signal is in an intermediate frequency band located between the respective bands of the high-band communication signal and the low-band communication signal.

However, the existing signal separation circuit illustrated in FIG. 25 is a so-called triplexer, which only branches signals in three frequency bands to respective three input/output units and, hence, such a circuit configuration in which signals are separated into respective frequency bands cannot be used.

A configuration illustrated in FIG. 26 may be thought of as an example of a branch circuit that can separate a communication signal, which includes a high-band communication signal and a low-band communication signal, and a GPS signal in an intermediate frequency band located between the respective bands of the high-band communication signal and the low-band communication signal. Referring to FIG. 26, a band elimination filter (BEF) 11 eliminates a GPS signal of 1.5 GHz. A SAW filter 28 blocks a high-band communication signal and a low-band communication signal, and allows the frequency band of a GPS signal to pass therethrough. A communication circuit 10 is connected to the output stage of the band elimination filter (BEF) 11 and a GPS receiver circuit 20 is connected to the output stage of the SAW filter 28.

However, a branch circuit having the configuration illustrated in FIG. 26 has the following problems.

FIG. 27A illustrates the impedance locus of the SAW filter 28 seen from a connection port P1 of an antenna 30 and FIG. 27B illustrates the impedance locus of the band elimination filter 11 seen from the connection port P1 of the antenna 30. FIG. 28 illustrates the frequency characteristics of an insertion loss (S21 of S-parameters) between the connection port P1 of the antenna 30 and an output port P2 of the band elimination filter 11. All the results were obtained by sweeping over the frequency range of 0.7 GHz to 2.7 GHz.

As can be seen from FIG. 27A and FIG. 27B, there is a frequency having the same phase in the same frequency band in the SAW filter 28 and the band elimination filter 11, and the low band of the eliminated band of the SAW filter 28 is on the short-circuit impedance side, such that a signal input from the antenna flows to the ground through the SAW filter 28. Hence, as illustrated by broken-line ellipses (left-hand side) in FIG. 28, an attenuation band is generated in a pass band on the low-band side from 1.5 GHz, which is the frequency band of a GPS signal. As a result, a low-band communication signal input to the communication circuit 10 illustrated in FIG. 26 is attenuated. In the example of FIG. 27A, the eliminated band of the SAW filter 28 is in a short-circuit impedance state in the low band, but the high band may be in a short-circuit impedance state or both bands may be in a short-circuit impedance state, depending on the design of the SAW filter. In the case where the high band is in a short-circuit impedance state, as illustrated by broken-line ellipses (right-hand side) in FIG. 28, an attenuation band is generated in the pass band of the high band, such that signals in the high band input to the communication circuit 10 illustrated in FIG. 26 are attenuated.

SUMMARY OF THE INVENTION

Preferred embodiments of the present invention provide a branch circuit and a branch cable that realize satisfactory branching characteristics by avoiding undesirable resonance generated by a SAW filter and a band elimination filter provided on two communication signal lines.

A branch circuit according to a preferred embodiment of the present invention includes a common antenna port, and a first communication signal line and a second communication signal line connected to the common antenna port, and the branch circuit is configured to separate a first communication signal (for example, a cellular signal) including a signal in a low-band (for example, 704 MHz to 960 MHz) and a signal in a high-band (for example, 1710 MHz to 2690 MHz) and a second communication signal (for example, a GPS signal) that is a signal in a frequency band between the low band and the high band.

The branch circuit includes a first-communication-signal-line-side band elimination filter that is provided on the first communication signal line and that is configured to reflect the second communication signal and allow the first communication signal to pass therethrough; a SAW filter that is provided on the second communication signal line and that is configured to allow the second communication signal to pass through a band thereof; and a second-communication-signal-line-side band elimination filter that is provided between the antenna port and the SAW filter and that is configured to reflect (make the filter appear open for an antenna at the frequency of the high band) at least a signal (for example, in the high band) of the first communication signal nearer to a frequency band of the second communication signal and configured to allow the second communication signal to pass therethrough.

With this configuration, the loss of the first communication signal due to the attenuation band of the SAW filter being on the short-circuit impedance side is avoided, such that favorable branching characteristics are realized.

It is preferable that a phase adjustment device be provided between the second-communication-signal-line-side band elimination filter and the SAW filter. With this configuration, the second-communication-signal-line-side band elimination filter and the SAW filter preferably are made to have the same phase, such that low-reflection characteristic in the pass band of the SAW filter is obtained.

It is preferable that the second-communication-signal-line-side band elimination filter is a band elimination filter configured to reflect a signal in the low band and a band elimination filter configured to reflect a signal in the high band. With this configuration, in the second-communication-signal-line-side band elimination filter, a communication signal in the high band and a communication signal in the low band are both reflected to the antenna side and the first-communication-signal-line side, such that the branching characteristics are enhanced.

A branch cable according to a preferred embodiment of the present invention is provided with a branch circuit located therein. The branch circuit includes a common antenna port, and a first communication signal line and a second communication signal line connected to the common antenna port. The branch circuit separates a first communication signal (for example, a cellular signal) including a signal in a low band (for example, 704 MHz to 960 MHz) and a signal in a high band (for example, 1710 MHz to 2690 MHz) and a second communication signal (for example, a GPS signal) that is a signal in a frequency band between the low band and the high band.

The cable preferably includes elongated dielectric element bodies, and signal conductors and ground conductors provided on the dielectric element bodies.

The first-communication-signal-line-side band elimination filter and the second-communication-signal-line-side band elimination filter are preferably defined by the signal conductors and ground conductors provided on the dielectric element bodies.

The first-communication-signal-line-side band elimination filter is provided on the first communication signal line, and is configured to reflect the second communication signal and allow the first communication signal to pass therethrough.

The second-communication-signal-line-side band elimination filter is provided on the second communication signal line, and is configured to reflect (make the filter appear to be open for an antenna at the frequency of the high band) at least a signal (for example, in the high band) of the first communication signal nearer to a frequency band of the second communication signal and configured to allow the second communication signal to pass therethrough.

With this configuration, an antenna port preferably is connected to the input/output ports of two communication circuits and, at the same time, separation in accordance with frequency bands is performed. Hence, there is no need to provide a branch circuit on a circuit substrate, resulting in a reduction in the size of and space occupied by an apparatus.

It is preferable that each of the first-communication-signal-line-side band elimination filter and the second-communication-signal-line-side band elimination filter include a parallel circuit including an inductor and a capacitor, and the inductor and the capacitor include the signal conductors and ground conductors provided on the dielectric element bodies. With this configuration, there is no need to mount individual components of the first-communication-signal-line-side band elimination filter and the second-communication-signal-line-side band elimination filter, resulting in easy reduction in thickness and high mass production capability.

It is preferable that a SAW filter that is connected to the output stage (communication circuit side) of the second-communication-signal-line-side band elimination filter, which is configured to attenuate the first communication signal and to allow the second communication signal to pass therethrough, be mounted on the branch cable. With this configuration, the branch cable preferably is used as a branch circuit including a SAW filter.

It is preferable that the dielectric element body be defined by a flexible dielectric material. With this configuration, the branch cable preferably is integrated into a small space within the casing of a communication apparatus into which the branch cable is to be integrated.

According to various preferred embodiments of the present invention, favorable branching characteristics are realized by avoiding undesired resonance due to the SAW filter and the first-communication-signal-line-side band elimination filter. Further, the branch circuit preferably is integrated into a small space within a casing.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
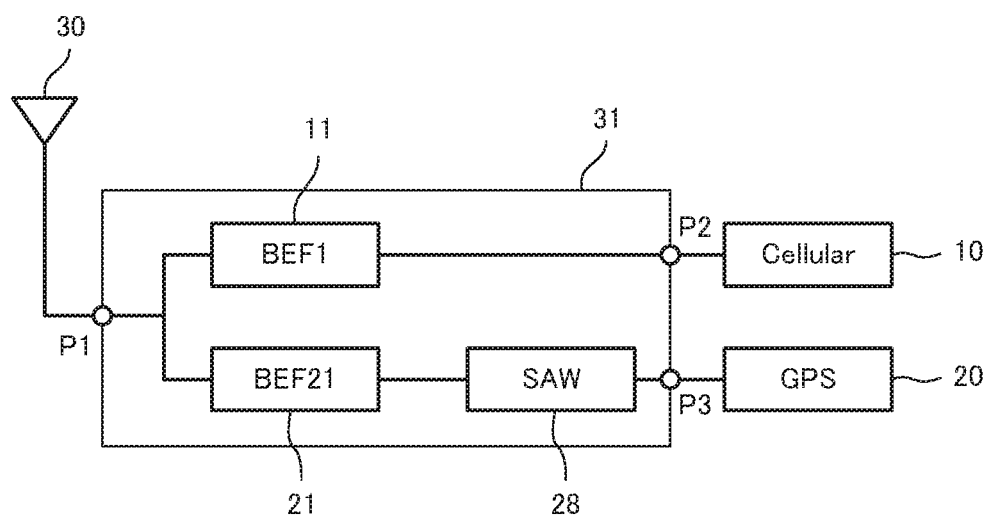
FIG. 1 is a block diagram of a communication apparatus including a branch circuit according to a first preferred embodiment of the present invention.

FIG. 1 is a block diagram of a communication apparatus including a branch circuit according to a first preferred embodiment of the present invention. The communication apparatus includes a branch circuit 31. The branch circuit 31, which includes a common antenna port P1, is a branch circuit that is configured to separate a first communication signal (cellular signal), which includes a signal in a low band and a signal in a high band, and a second communication signal (GPS signal) which is a signal in a frequency band between the low band and the high band. Hereinafter, the "first communication signal" is called a "cellular signal" and the "second communication signal" is called a "GPS signal".

In this example, the frequency bands preferably are as follows:
Low band (800 MHz band: 704 MHz to 960 MHz)
High band (2.2 GHz band: 1710 MHz to 2690 MHz)
GPS signal (1.5 GHz band: 1574 MHz to 1606 MHz)

An antenna 30 is connected to the antenna port P1 of the branch circuit 31. A communication circuit 10 for a cellular signal is connected to a cellular signal port P2 of the branch circuit 31 and a GPS receiver circuit 20 is connected to a GPS signal port P3 of the branch circuit 31.

A portion between the antenna port P1 and the cellular signal port P2 of the branch circuit 31 is a cellular signal line and a portion between the antenna port P1 and the GPS signal port P3 of the branch circuit 31 is a GPS signal line. A cellular-signal-line-side band elimination filter 11 is provided on the cellular signal line. A SAW filter 28 and a GPS-signal-line-side band elimination filter 21 are provided on the GPS signal line. The GPS-signal-line-side band elimination filter 21 is provided between the antenna port P1 and the SAW filter 28.

The cellular-signal-line-side band elimination filter 11 is configured to reflect the second communication signal (GPS signal) (that is, the cellular-signal-line-side band elimination filter 11 makes itself appear to be open when seen from the antenna port P1 at the frequency of the GPS signal) and allows the first communication signal (cellular signal) to pass therethrough. The GPS-signal-line-side band elimination filter 21 is configured to reflect a signal in the high band (1710 MHz to 2690 MHz), which is nearer to the frequency band of the GPS signal among the cellular signals (that is, the GPS-signal-line-side band elimination filter 21 makes itself appear to be open when seen from the antenna port P1 at a signal frequency in the high band) and allows the GPS signal to pass therethrough. The SAW filter 28 allows the GPS signal to pass therethrough.

Figure 2:
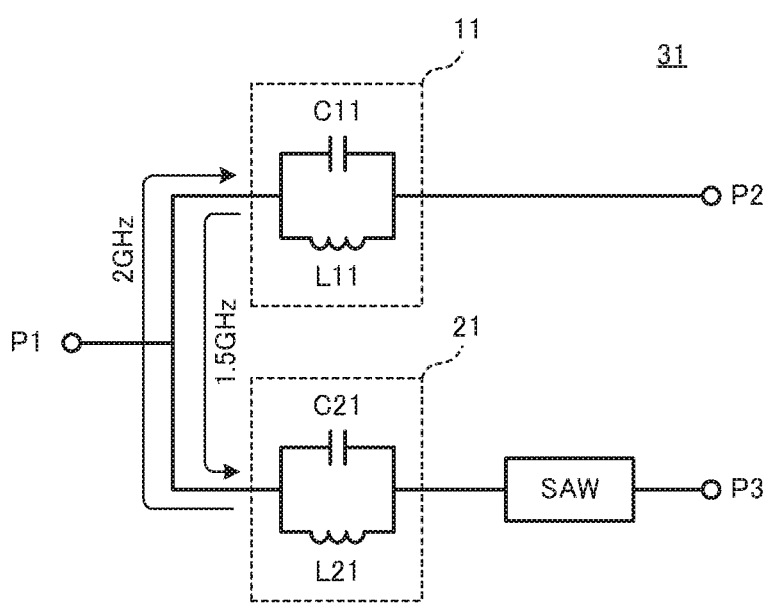
FIG. 2 is a circuit diagram of a branch circuit 31 illustrated in FIG. 1.

FIG. 2 is a circuit diagram of the branch circuit 31 illustrated in FIG. 1. The cellular-signal-line-side band elimination filter 11 includes a parallel circuit including an inductor L11 and a capacitor C11. The GPS-signal-line-side band elimination filter 21 includes a parallel circuit including an inductor L21 and a capacitor C21. The resonant frequency of the parallel circuit including the inductor L11 and the capacitor C11 is 1.5 GHz, which is the frequency of the GPS signal. Hence, the signal of 1.5 GHz is reflected by the cellular-signal-line-side band elimination filter 11 and input through the GPS-signal-line-side band elimination filter 21.

The resonant frequency of the parallel circuit including the inductor L21 and the capacitor C21 is 2 GHz, which is the frequency of the high-band. Hence, a signal in the 2.2 GHz band is reflected by the GPS-signal-line-side band elimination filter 21, and is output from the cellular signal port P2 through the cellular-signal-line-side band elimination filter 11.

Figure 3:
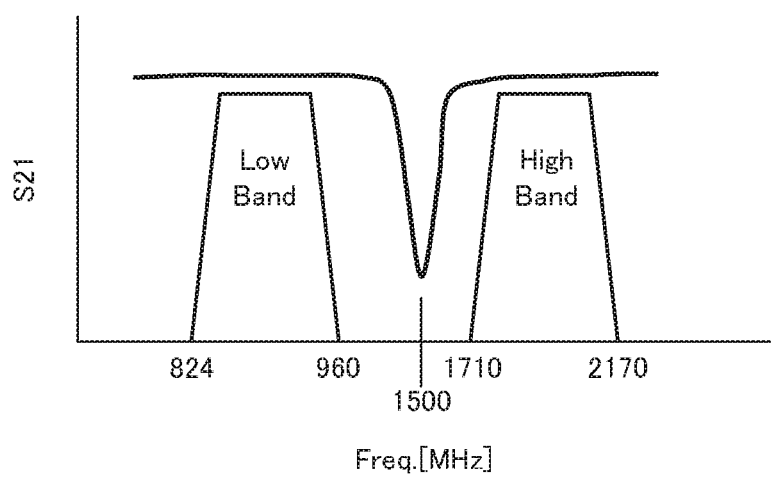
FIG. 3 is a diagram illustrating the frequency characteristics of an insertion loss (S21) between an antenna port P1 and a cellular signal port P2 of a branch circuit 31.

FIG. 3 is a diagram illustrating the frequency characteristics of an insertion loss (S21) between the antenna port P1 and the cellular signal port P2 of the branch circuit 31. As illustrated in the figure, 1.5 GHz, which is the frequency band of a GPS signal, is considerably attenuated. Further, as is clear from comparison with the example illustrated in FIG. 24, undesired attenuation is not generated in the low band and the high band.

Second Preferred Embodiment

Figure 4:
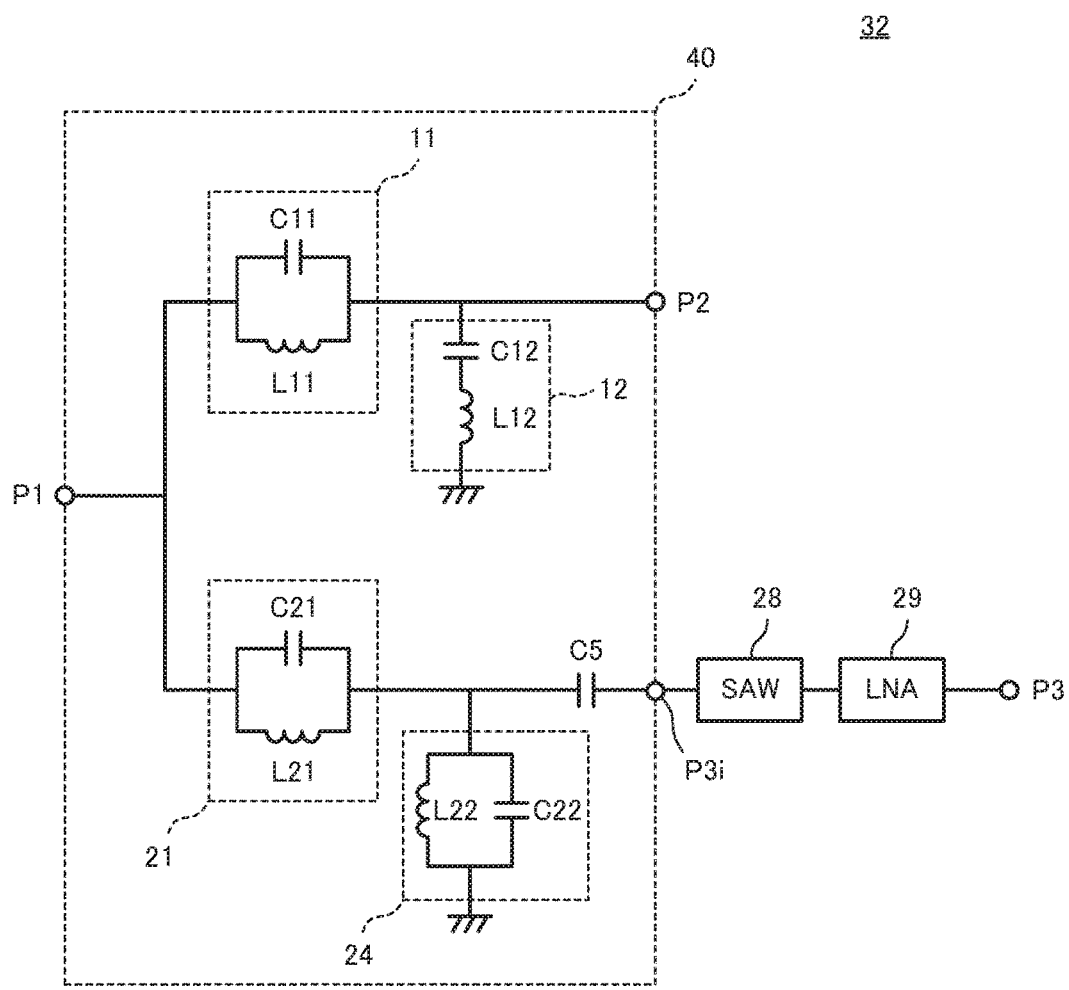
FIG. 4 is a circuit diagram of a branch circuit 32 according to a second preferred embodiment of the present invention.

FIG. 4 is a circuit diagram of a branch circuit 32 according to a second preferred embodiment of the present invention. The branch circuit 32 includes an antenna port P1, a cellular signal port P2 and a GPS signal port P3. The branch circuit 32 separates a first communication signal (cellular signal), which includes a signal in a low band and a signal in a high band, and a second communication signal (GPS signal), which is a signal in a frequency band between the low band and the high band.

Two cellular-signal-line-side band elimination filters 11 and 12 are provided on a cellular signal line. A SAW filter 28, a GPS-signal-line-side band elimination filter 21, and a band pass filter 24 are provided on a GPS signal line. The band pass filter 24 is provided between the GPS-signal-line-side band elimination filter 21 and the SAW filter 28. A capacitor C5 is provided between the band pass filter 24 and the SAW filter 28. A low-noise amplifier (LNA) 29 is provided in a stage subsequent to the SAW filter 28.

The configuration of the cellular-signal-line-side band elimination filter 11 preferably is the same as that of the cellular-signal-line-side band elimination filter 11 described in the first preferred embodiment. Another cellular-signal-line-side band elimination filter 12 includes a series circuit including an inductor L12 and a capacitor C12 and is connected to the cellular signal line as a shunt. The resonant frequency of the cellular-signal-line-side band elimination filter 12 preferably is the same or approximately the same as the resonant frequency of the cellular-signal-line-side band elimination filter 11. Hence, the strength of the GPS signal output from the cellular signal port P2 is further reduced by the two cellular-signal-line-side band elimination filters 11 and 12. Since the cellular-signal-line-side band elimination filter 11, which is an LC parallel circuit, among the two cellular-signal-line-side band elimination filters 11 and 12 is connected to the antenna port P1, the GPS signal is reflected to the GPS signal line side.

The configuration of the GPS-signal-line-side band elimination filter 21 is preferably the same as that of the GPS-signal-line-side band elimination filter 21 described in the first preferred embodiment and reflects a communication signal in the high band. The band pass filter 24 allows the frequency band of a GPS signal to pass therethrough, and blocks a communication signal in the high band and a communication signal in the low band. The band pass filter 24 and the SAW filter 28 provide a multiple-stage configuration, such that the selectively of a GPS signal is enhanced.

The capacitor C5 is a device configured to adjust the phase between the band pass filter 24 and the SAW filter 28. In addition, the band pass filter 24 also is configured to operate as an impedance matching circuit between the GPS-signal-line-side band elimination filter 21 and the SAW filter 28.

In FIG. 4, a circuit portion including the two cellular-signal-line-side band elimination filters 11 and 12, the GPS-signal-line-side band elimination filter 21, the band pass filter 24, and the capacitor C5 is preferably configured as a branch cable 40 described later in another preferred embodiment.

Figure 5:
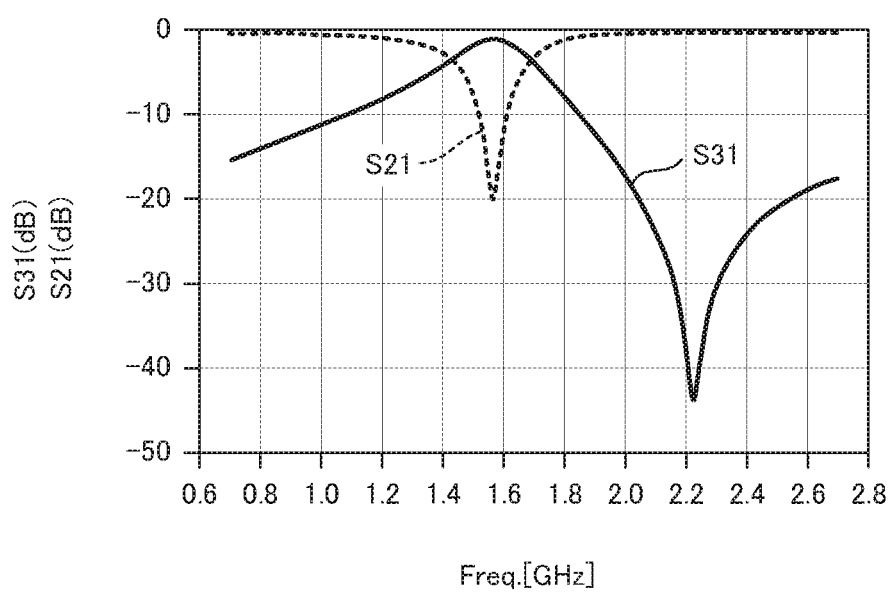
FIG. 5 is a diagram illustrating the respective frequency characteristics of an insertion loss S21 between the antenna port P1 and the cellular signal port P2 and an insertion loss S31 between the antenna port P1 and the input stage of a SAW filter, in the branch circuit 32 illustrated in FIG. 4.

FIG. 5 is a diagram illustrating the respective frequency characteristics of an insertion loss S21 between the antenna port P1 and the cellular signal port P2 and an insertion loss S31 between the antenna port P1 and the input stage of the SAW filter, in the branch circuit 32 illustrated in FIG. 4. As illustrated in FIG. 5, the two cellular-signal-line-side band elimination filters 11 and 12 eliminate 1.5 GHz, which is a GPS signal, and the GPS-signal-line-side band elimination filter 21 eliminates 2.2 GHz, which is a communication signal in the high band. The band pass filter 24 allows 1.5 GHz, which is a GPS signal, to pass therethrough.

Figure 6:
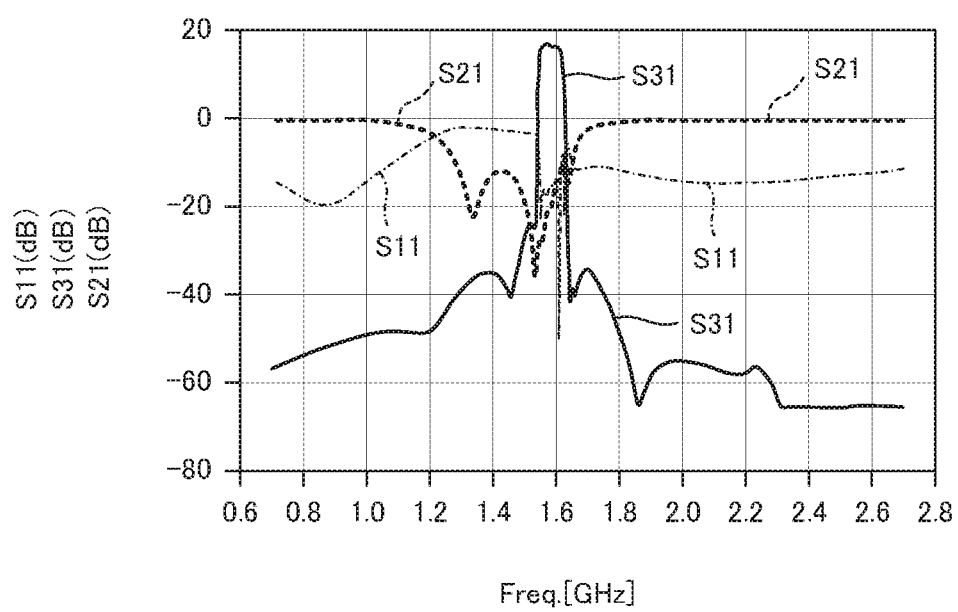
FIG. 6 is a diagram illustrating the respective frequency characteristics of an insertion loss S21 between the antenna port P1 and the cellular signal port P2, an insertion loss S31 between the antenna port P1 and a GPS signal port P3, and a return loss of the antenna port P1, in the branch circuit 32 illustrated in FIG. 4.

FIG. 6 is a diagram illustrating the respective frequency characteristics of an insertion loss S21 between the "antenna port P1" and the "cellular signal port P2", an insertion loss S31 between the "antenna port P1" and the "GPS signal port P3", and a return loss S11 of the antenna port P1, in the branch circuit 32 illustrated in FIG. 4. Unlike the case of FIG. 5, these characteristics are characteristics including those of the SAW filter 28 and the LNA 29. As illustrated in FIG. 6, the strength of a GPS signal (S31) having passed through the LNA 29 is about 17 dB. In the high band and the low band, the strength of a GPS signal (S31) is decreased to about −50 dB. The strength of a cellular signal (S21) is about −0.3 dB in the pass band and about −16 dB in the attenuation region. Further, the return loss S11 at the antenna port P1 is as low as about −10 dB.

Figure 7:
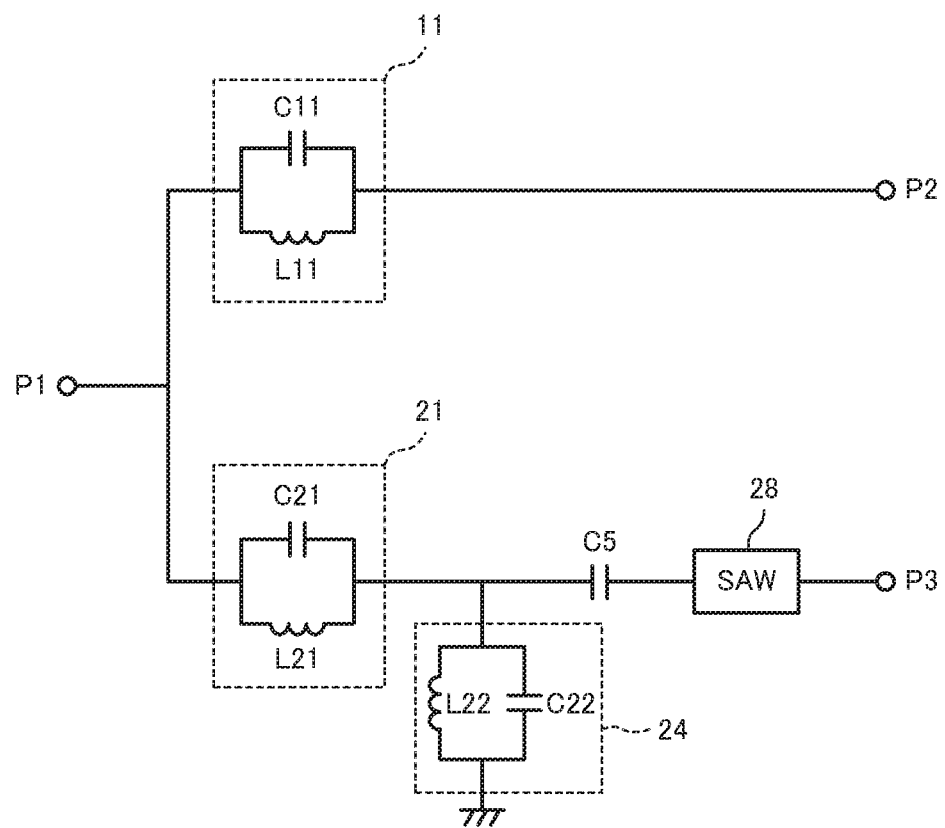
FIG. 7 illustrates a modification of the branch circuit 32 illustrated in FIG. 4.

FIG. 7 illustrates a modification of the branch circuit 32 illustrated in FIG. 4. This branch circuit includes a single-stage cellular-signal-line-side band elimination filter 11 provided on the cellular signal line. Further, the branch circuit does not include an LNA therewithin. The rest of the configuration is preferably the same as that of the branch circuit 32 illustrated in FIG. 4. In this manner, a signal in the eliminated band is reflected by using a configuration in which a parallel circuit including an inductor and a capacitor is connected in series with the line in the case where a single-stage band elimination filter is used.

Third Preferred Embodiment

Figure 8:
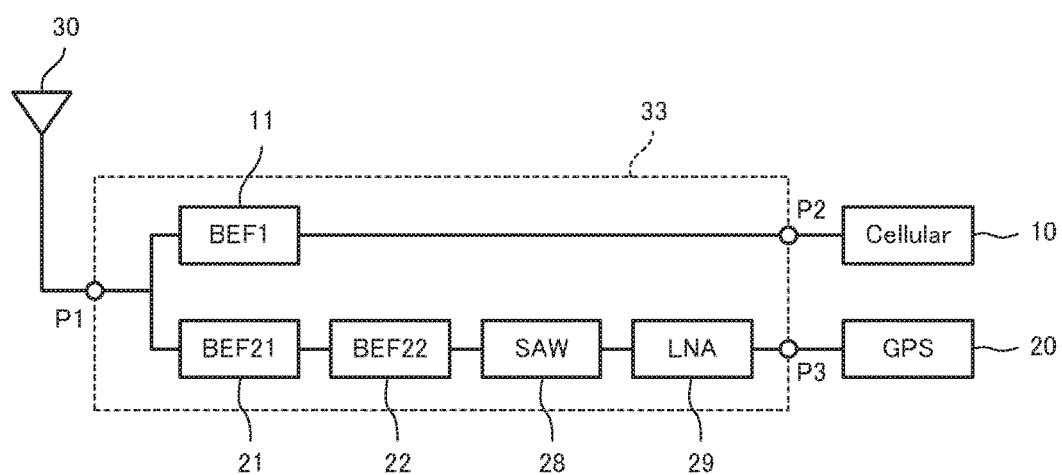
FIG. 8 is a block diagram of a communication apparatus including a branch circuit 33 according to a third preferred embodiment of the present invention.

FIG. 8 is a block diagram of a communication apparatus including a branch circuit 33 according to a third preferred embodiment of the present invention. The branch circuit 33 includes an antenna port P1, a cellular signal port P2, and a GPS signal port P3. The branch circuit 33 separates a first communication signal (cellular signal), which includes a signal in a low band and a signal in a high band, and a second communication signal (GPS signal), which is a signal in a frequency band between the low band and the high band.

An antenna 30 is connected to the antenna port P1 of the branch circuit 33. A communication circuit 10 for cellular signals is connected to the cellular signal port P2 of the branch circuit 33, and a GPS receiver circuit 20 is connected to the GPS signal port P3 of the branch circuit 33.

Unlike the branch circuit 31 illustrated in FIG. 1, two GPS-signal-line-side band elimination filters 21 and 22 are provided on a GPS signal line. Further, an LNA 29 is provided in a stage subsequent to the SAW filter 28. The rest of the configuration is preferably the same as that of the branch circuit 31 illustrated in FIG. 1.

Figure 9A:
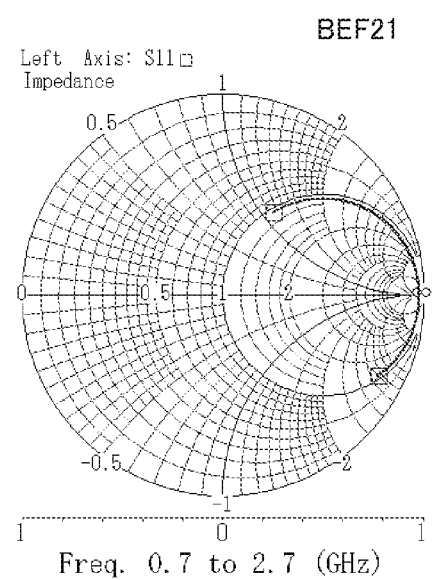
FIG. 9A is a diagram in which the impedance locus of a band elimination filter 21 is represented on the Smith chart.
Figure 9B:
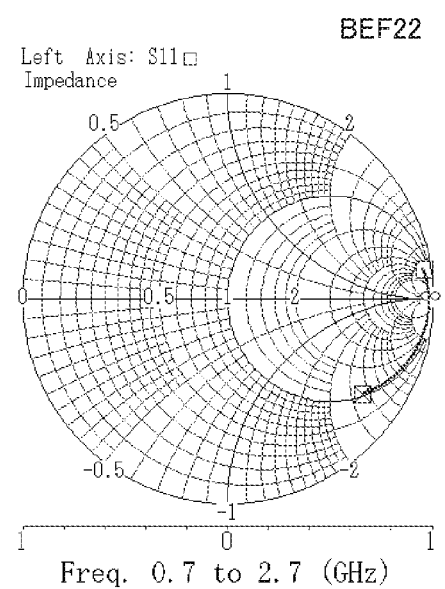
FIG. 9B is a diagram in which the impedance locus of the GPS-signal-line-side band elimination filter 22 is represented on the Smith chart.
Figure 9C:
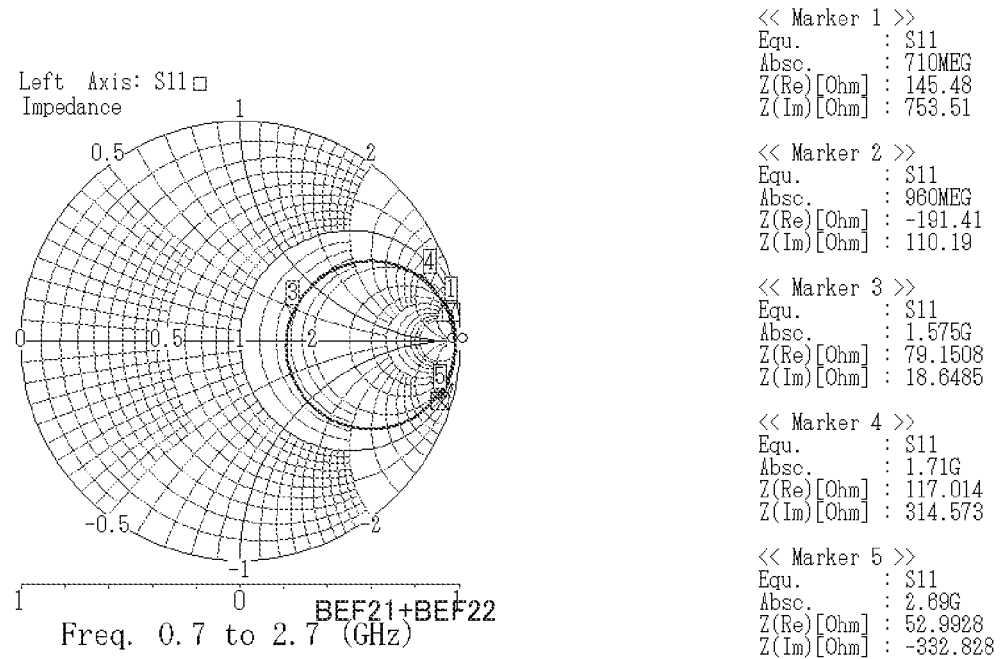
FIG. 9C is a diagram in which the impedance locus of the band elimination filters 21 and 22 configured in a two-stage configuration is represented on the Smith chart.
Figure 10:
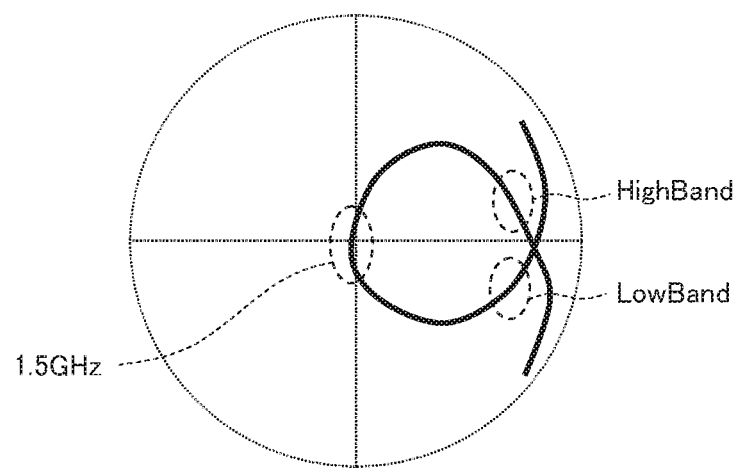
FIG. 10 is a diagram illustrating a schematic representation of FIG. 9C.

FIG. 9A is a diagram in which the impedance locus of the band elimination filter 21 is represented on the Smith chart. FIG. 9B is a diagram in which the impedance locus of the GPS-signal-line-side band elimination filter 22 is represented on the Smith chart. FIG. 9C is a diagram in which the impedance locus of the band elimination filters 21 and 22 in a two-stage configuration is represented on the Smith chart. FIG. 10 is a diagram illustrating a schematic representation of FIG. 9C.

As is clear from these figures, the band elimination filters 21 and 22 in a two-stage configuration allow a GPS signal to pass therethrough and appear to be approximately open for a high-band cellular signal, and the band elimination filter 22 appears to be approximately open for a low-band cellular signal. Hence, undesirable resonance does not appear in both the low-band side and the high-band side of 1.5 GHz, which is the frequency band of a GPS signal.

Figure 11:
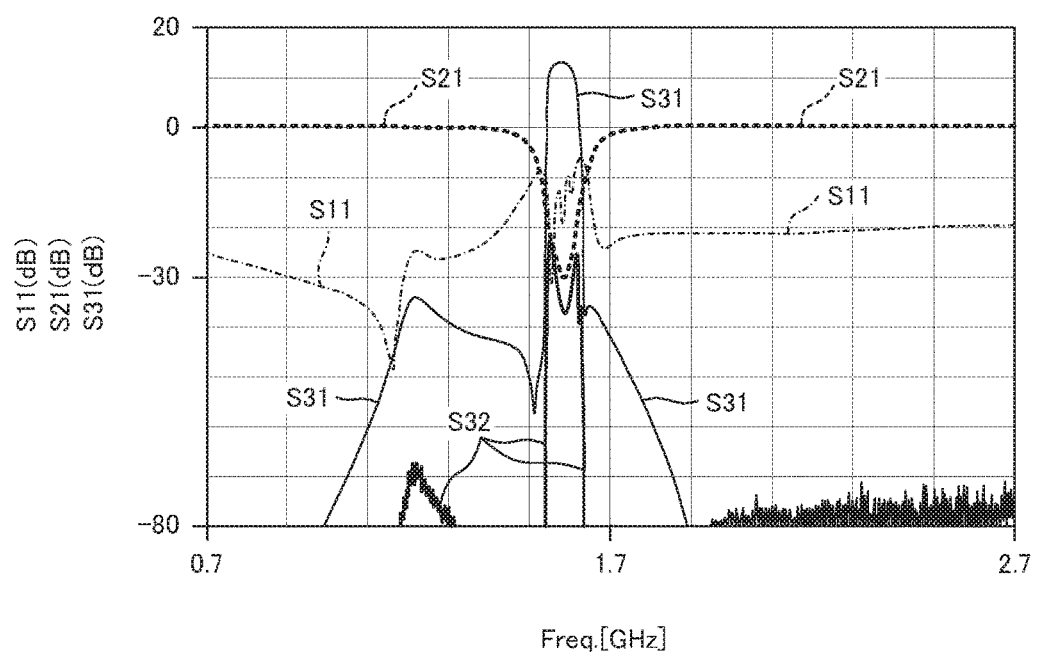
FIG. 11 is a diagram illustrating the respective frequency characteristics of the insertion loss S21 between the antenna port P1 and the cellular signal port P2, the insertion loss S31 between the antenna port P1 and the GPS signal port P3, the return loss of the antenna port P1, and an insertion loss (leakage component) S32 between the port P2 and the port P3, in the branch circuit 33 illustrated in FIG. 8.

FIG. 11 is a diagram illustrating the respective frequency characteristics of an insertion loss S21 between the antenna port P1 and the cellular signal port P2, an insertion loss S31 between the "antenna port P1" and the "GPS signal port P3", the return loss S11 of the antenna port P1, and an insertion loss (leakage component) S32 between the port P2 and the port P3, in the branch circuit 33 illustrated in FIG. 8. As illustrated in FIG. 11, the strength of the GPS signal (S31) having passed through the LNA 29 is approximately 13 dB. The GPS signal (S31) is attenuated to approximately −80 dB or less in the high band and the low band. The strength of the cellular signal (S21) is approximately −0.1 dB in the pass band and approximately −20 dB in the attenuation region. Further, the return loss S11 at the antenna port P1 is as low as −20 dB.

Note that since the GPS-signal-line-side band elimination filters 21 and 22 in a two-stage configuration are both defined by LC parallel circuits, the order in which they are connected to each other may be reversed.

Fourth Preferred Embodiment

Figure 12:
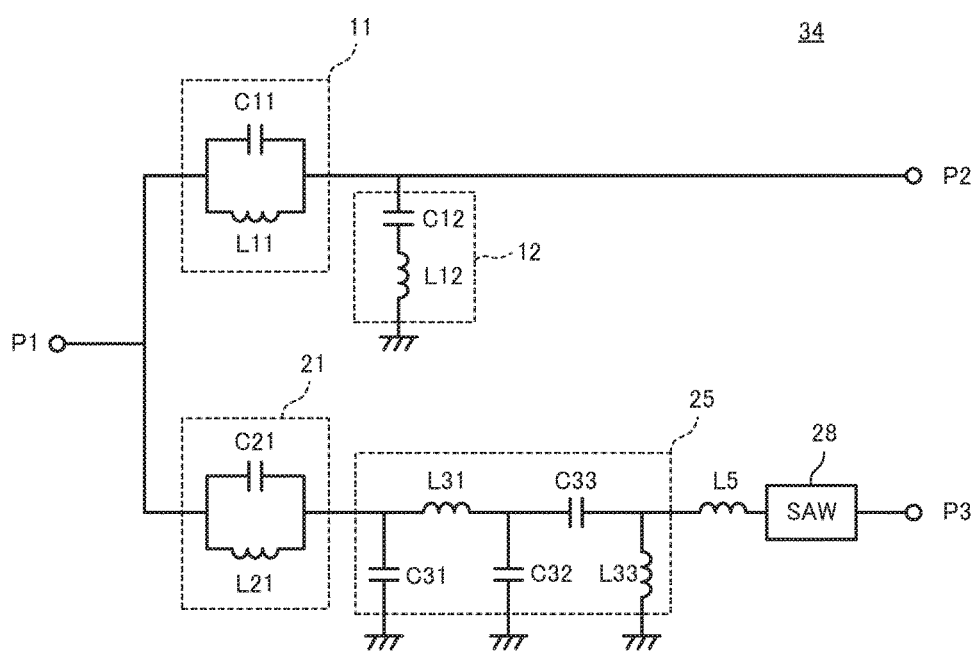
FIG. 12 is a circuit diagram of a branch circuit 34 according to a fourth preferred embodiment of the present invention.

FIG. 12 is a circuit diagram of a branch circuit 34 according to a fourth preferred embodiment of the present invention. The branch circuit 34 includes an antenna port P1, a cellular signal port P2 and a GPS signal port P3. The branch circuit 34 is configured to separate a first communication signal (cellular signal), which includes a signal in a low band and a signal in a high band, and a second communication signal (GPS signal), which is a signal in a frequency band between the low band and the high band.

Unlike the branch circuit illustrated in FIG. 4, the resonant frequency is determined in such manner that the GPS-signal-line-side band elimination filter 21 appears to be approximately open for the low band. A band pass filter 25 for a GPS signal preferably is a low pass filter including a capacitor C31, a capacitor C32, and an inductor L31 and a high pass filter including a capacitor C33 and an inductor L33. Further, unlike the branch circuit illustrated in FIG. 4, an inductor L5 configured to perform phase adjustment is provided between the band pass filter 25 and the SAW filter 28. Further, an LNA is not provided within the branch circuit in the example of FIG. 12. The rest of the configuration is preferably the same as that of the branch circuit 32 illustrated in FIG. 4.

Figure 13:
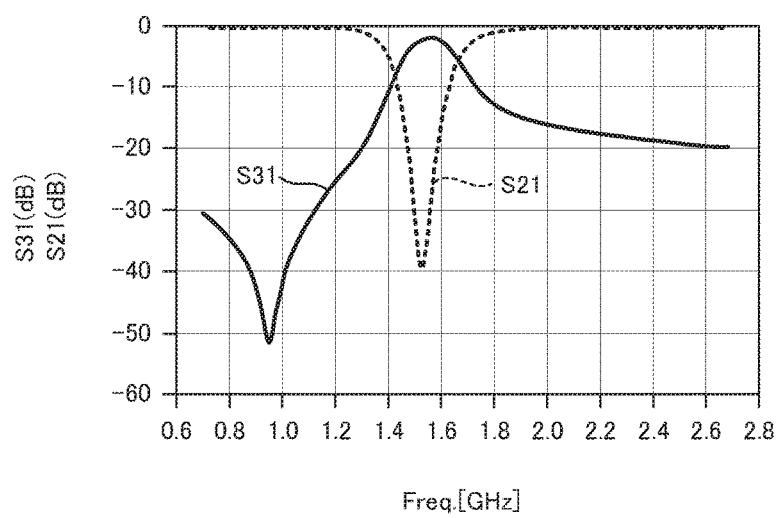
FIG. 13 is a diagram illustrating the respective frequency characteristics of the insertion loss S21 between the antenna port P1 and the cellular signal port P2 and the insertion loss S31 between the antenna port P1 and the input stage of the SAW filter, in the branch circuit 32 illustrated in FIG. 12.

FIG. 13 is a diagram illustrating the respective frequency characteristics of an insertion loss S21 between the antenna port P1 and the cellular signal port P2 and an insertion loss S31 between the antenna port P1 and the input stage of the SAW filter, in the branch circuit 32 illustrated in FIG. 12. As illustrated in FIG. 13, the cellular-signal-line-side band elimination filters 11 and 12 eliminate a GPS signal (signal in the 1.5 GHz band), and the GPS-signal-line-side band elimination filter 21 eliminates a communication signal in the low band (signal in the 0.95 GHz band). The band pass filter 25 allows a GPS signal (signal in the 1.5 GHz band) to pass therethrough.

Fifth Preferred Embodiment

Figure 14:
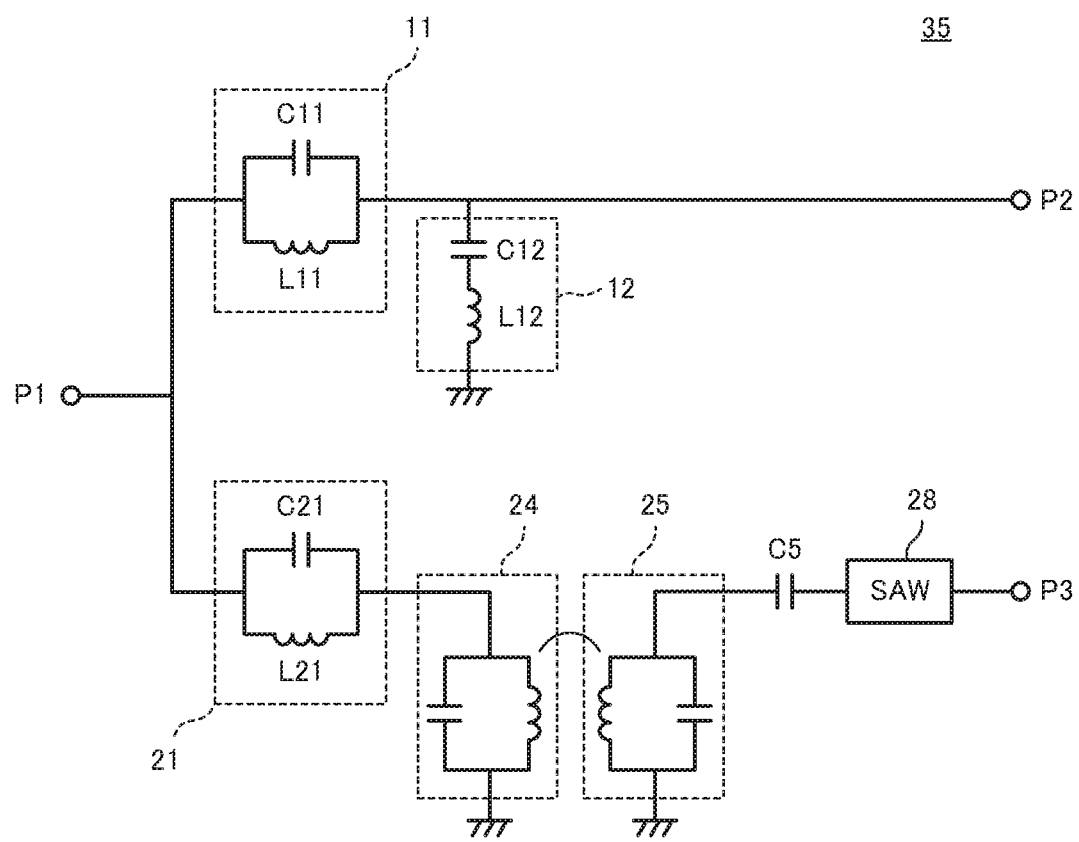
FIG. 14 is a circuit diagram of a branch circuit 35 according to a fifth preferred embodiment of the present invention.

FIG. 14 is a circuit diagram of a branch circuit 35 according to a fifth preferred embodiment of the present invention. The branch circuit 35 includes an antenna port P1, a cellular signal port P2 and a GPS signal port P3. The branch circuit 35 separates a first communication signal (cellular signal), which includes a signal in a low band and a signal in a high band, and a second communication signal (GPS signal), which is a signal in a frequency band between the low band and the high band.

Unlike the branch circuit illustrated in FIG. 4, band pass filters 24 and 25 are provided in a two-stage configuration on a GPS signal line. The band pass filters 24 and 25 provided in a two-stage configuration are coupled to each other through magnetic coupling between inductors. A capacitor C5 for phase adjustment is inserted between the band pass filter 25 and the SAW filter 28. Further, an LNA is not provided in the example of FIG. 14. The rest of the configuration preferably is the same as that of the branch circuit 32 illustrated in FIG. 4.

In this manner, the filter circuits may be coupled to each other through a magnetic field. As a result, an electrostatic breakdown voltage for the LNA and GPS receiver circuit is increased.

Sixth Preferred Embodiment

Figure 15:
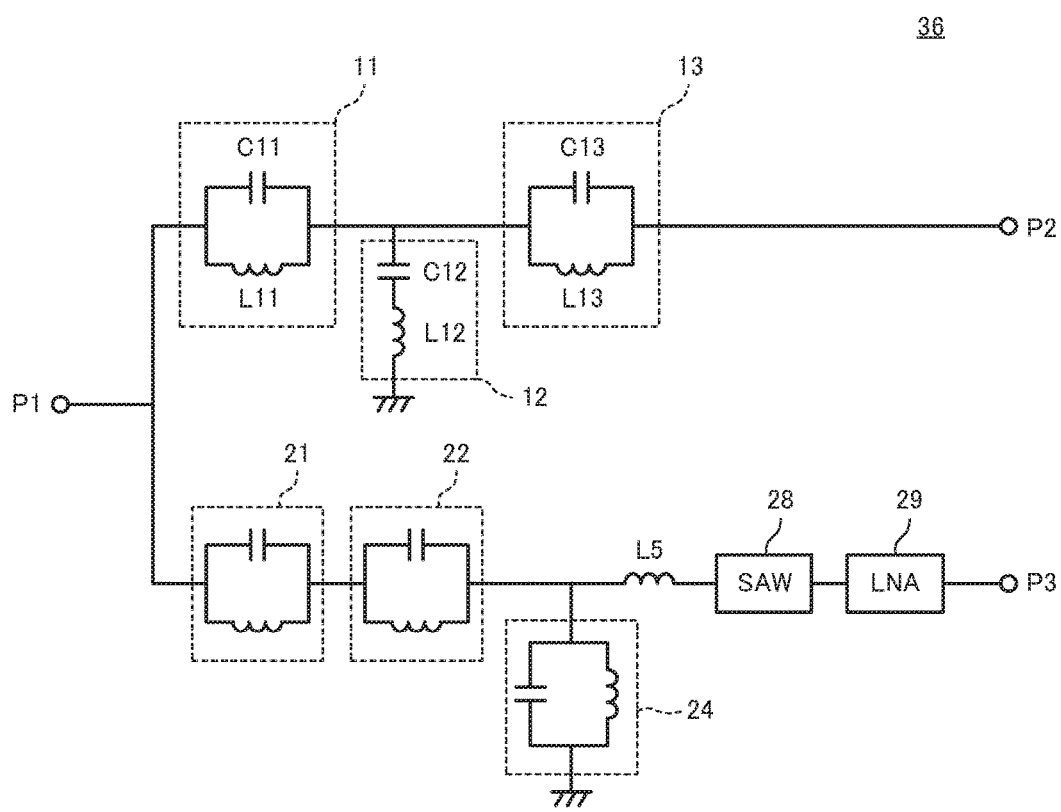
FIG. 15 is a circuit diagram of a branch circuit 36 according to a sixth preferred embodiment of the present invention.

FIG. 15 is a circuit diagram of a branch circuit 36 according to a sixth preferred embodiment of the present invention. Unlike the branch circuit illustrated in FIG. 4, band elimination filters 11, 12, and 13 are provided in a three-stage configuration on a cellular signal line. Further, band elimination filters 21 and 22 are provided in a two-stage configuration on a GPS signal line. The band elimination filters 21 and 22 provided in a two-stage configuration allow a GPS signal to pass therethrough and appear to be approximately open to the high band of a cellular signal. The band elimination filter 22 appears to be approximately open to the low band of a cellular signal.

The resonant frequency of the cellular-signal-line-side band elimination filters 11, 12, and 13 is the frequency band of a GPS signal, and a GPS signal is reflected. An inductor L5 is a phase adjustment device, and a band pass filter 24 and the inductor L5 perform impedance matching between a group including a SAW filter 28 and an LNA 29 and a group including the band elimination filters 21 and 22 in a two-stage configuration.

Seventh Preferred Embodiment

Figure 16:
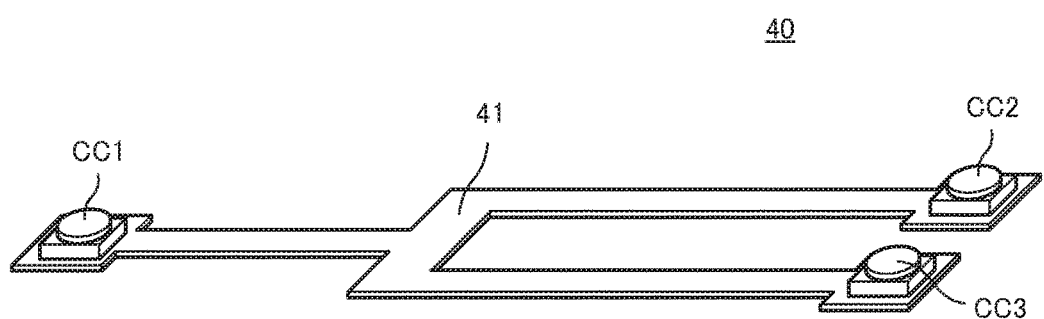
FIG. 16 is a perspective view of a branch cable 40 according to a seventh preferred embodiment of the present invention.

FIG. 16 is a perspective view of a branch cable 40 according to a seventh preferred embodiment of the present invention. The branch cable 40 defines a portion of the branch circuit 32 illustrated in FIG. 4 other than the SAW filter 28 and the LNA 29. The branch cable 40 preferably includes a multilayer body 41 including elongated dielectric element bodies and coaxial connectors CC1, CC2, and CC3 attached thereto. The coaxial connector CC1 corresponds to the antenna port P1 illustrated in FIG. 4 and the coaxial connectors CC2 and CC3 respectively correspond to the port P2 and port P3$i$ illustrated in FIG. 4. The dielectric element bodies are preferably made of a flexible dielectric material such as a liquid crystal polymer or polyimide.

Figure 17:
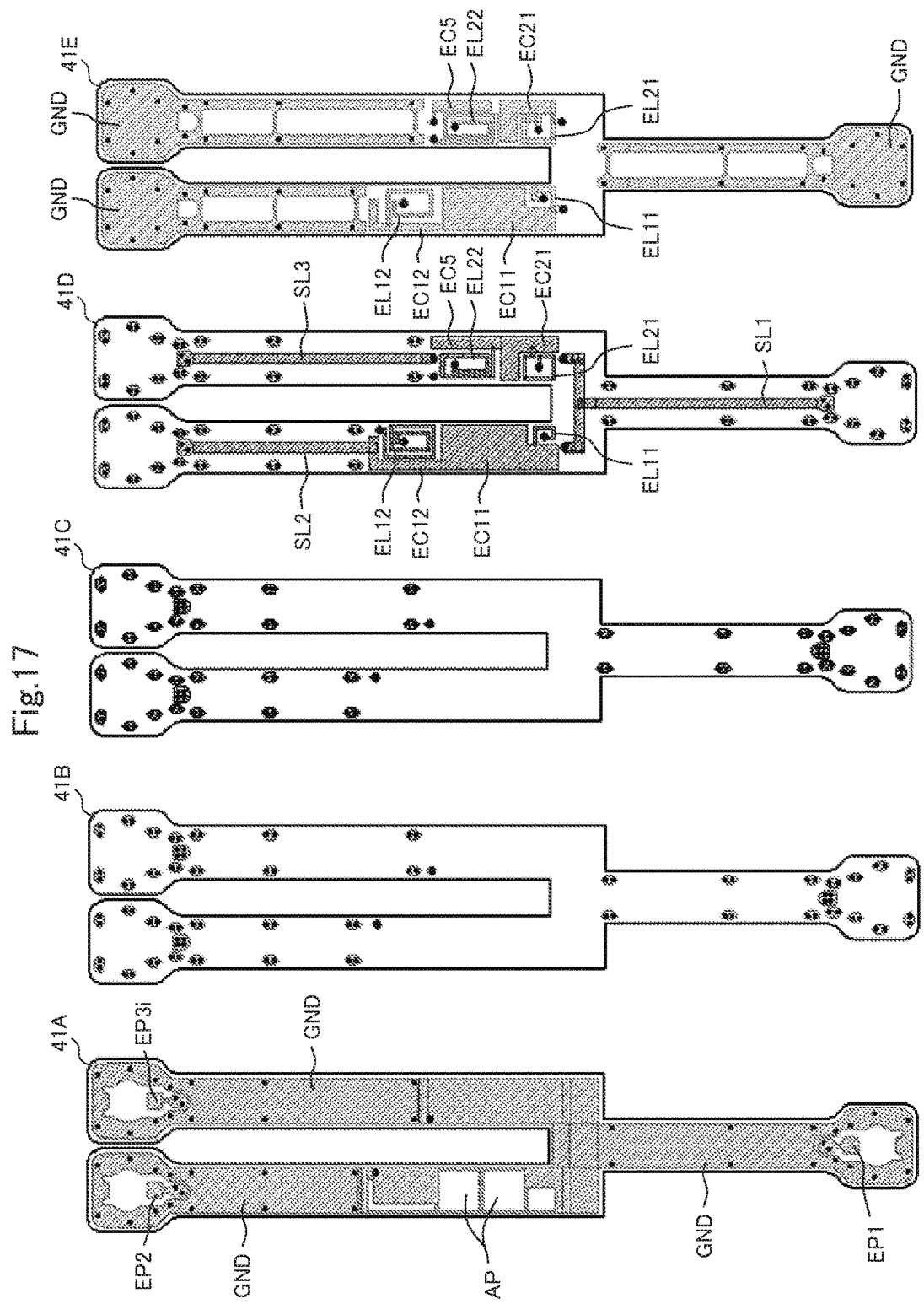
FIG. 17 is an exploded plan view of electrode patterns provided on respective layers of dielectric element bodies.

FIG. 17 is an exploded plan view of electrode patterns provided on layers of the dielectric element bodies. A first layer 41A is the uppermost layer and a fifth layer 41E is the lowermost layer. Electrodes EP1, EP2, and EP3$i$ corresponding to the ports P1, P2, and P3$i$ are provided on the first layer 41A. Further, a ground conductor GND is provided. Electrodes EC11, EC12, EC21, and EC5 corresponding to the capacitors C11, C12, C21, and C5 are provided on a fourth layer 41D and a fifth layer 41E. Further, electrodes EL11, EL12, EL21, and EL22 corresponding to the inductors L11, L12, L21, and L22 are provided on the fourth layer 41D and the fifth layer 41E. A capacitor C22 is provided between the ground conductor GND of the first layer 41A and the electrodes EC5 and EC21. Cut-out portions (portions without electrodes) AP are provided in the ground conductor GND of the first layer 41A so as to prevent a large capacitance from being generated between the electrode EC11 and the ground conductor GND of the first layer 41A.

Signal conductors (line electrodes) SL1, SL2 and SL3 are provided on the fourth layer 41D, and a ground conductor GND is provided on the fifth layer 41E. A tri-plate strip line structure is defined by the signal conductors SL1, SL2 and SL3 and the ground conductors GND of the first layer 41A and the fifth layer 41E.

Via electrodes for interlayer connection are provided in the layers 41A to 41E. In particular, via conductors configured to provide interlayer connection of the ground conductors GND and via conductors configured to provide interlayer connection of the electrodes EP1, EP2, and EP3$i$ are provided in the second layer 41B and the third layer 41C.

The coaxial connectors CC1, CC2, and CC3 are mounted on the electrodes EP1, EP2, and EP3$i$ illustrated in FIG. 16.

The branch cable 40 configured as described above is connected to the coaxial receptacles of a circuit substrate provided in the casing of a communication apparatus in which the branch cable 40 is to be housed. In other words, the coaxial connector CC1 is connected to an antenna, the coaxial connector CC2 is connected to a communication circuit for a cellular signal, and the coaxial connector CC3 is connected to the SAW filter on a GPS signal line. Hence, a branch circuit preferably is defined only by housing the branch cable 40 in the casing of a communication apparatus in which the branch cable 40 is to be housed. Routing of this branch cable, which has an elongated shape and is thin and flexible, preferably is performed, for example, on the back side of a battery pack within the casing of the communication apparatus.

Figure 18:
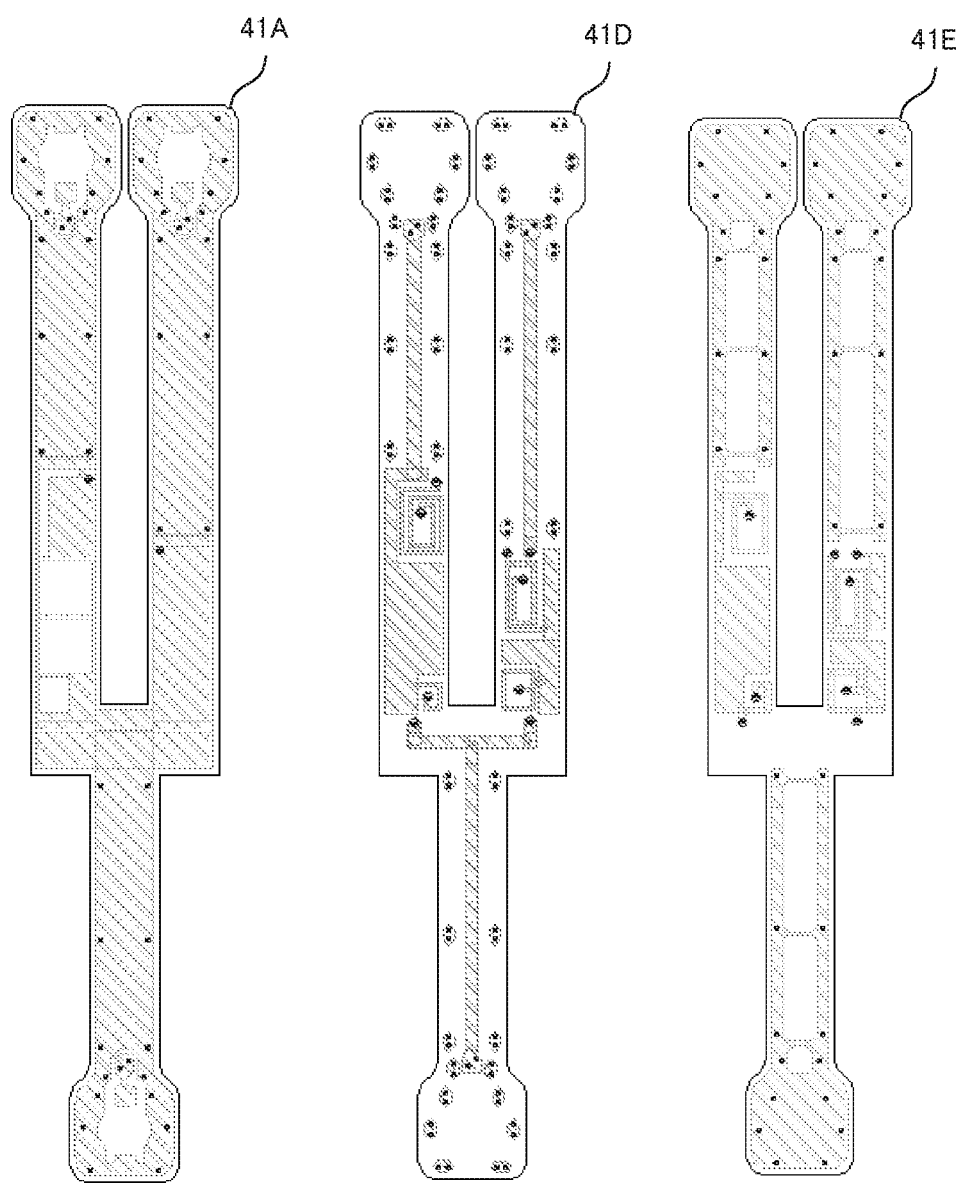
FIG. 18 is an exploded plan view of electrode patterns provided on respective layers in the case where the multi-layer body includes three layers of dielectric element bodies.

In the example illustrated in FIG. 17, the multilayer body preferably includes five layers of dielectric element bodies. However, that the number of stacked layers is not limited to this. For example, FIG. 18 is an exploded plan view of electrode patterns provided on respective layers in the case where the multilayer body includes three layers of dielectric element bodies. In this example, layers corresponding to the second layer 41B and the third layer 41C illustrated in FIG. 17 do not exist. The thickness of the dielectric element body of the first layer 41A is increased instead, such that the gap between the ground conductor GND provided on the first layer 41A and the signal conductors SL1, SL2 and SL3 provided on the fourth layer 41D is made to have a predetermined size.

Eighth Preferred Embodiment

Figure 19:
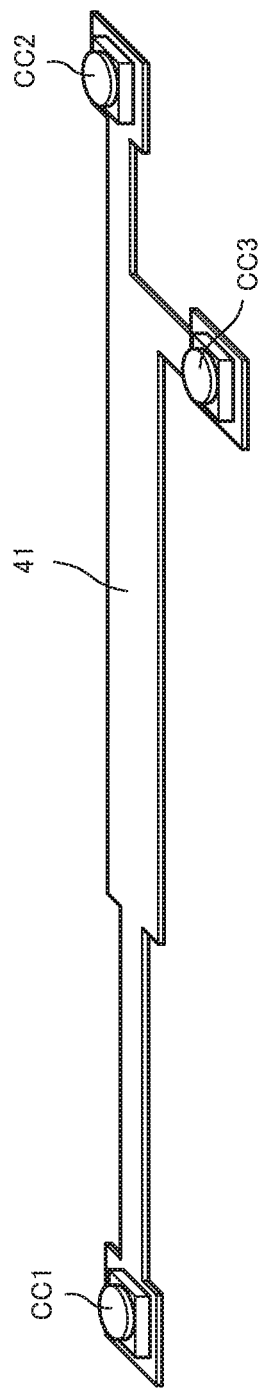
FIG. 19 is an external perspective view of a branch cable according to an eighth preferred embodiment of the present invention.

FIG. 19 is an external perspective view of a branch cable according to an eighth preferred embodiment of the present invention. This branch cable includes a multilayer body 41 including dielectric element bodies and coaxial connectors CC1, CC2, and CC3 attached thereto. In the example illustrated in FIG. 16, the multilayer body including dielectric element bodies was shaped like a tuning fork which has two branches extending from the antenna port to the cellular signal port and the GPS signal port. However, the external shape of the cable is not limited to that of a tuning fork, and it is only required that the concentric connectors be arranged at desired positions, as illustrated in FIG. 19.

For example, all the branch circuits illustrated in FIG. 15 may be provided on the branch cable, by mounting the SAW filter and LNA on the multilayer body 41. In this case, the coaxial connector CC1 corresponds to the antenna port P1 illustrated in FIG. 15, and the coaxial connectors CC2 and CC3 respectively correspond to the ports P2 and P3 illustrated in FIG. 15.

Note that coplanar-line connection portions may be provided rather than providing coaxial connectors on a branch cable.

Ninth Preferred Embodiment

In a ninth preferred embodiment of the present invention, a branch circuit and a branch cable will be described which take into consideration a relationship between branching characteristics and distances from a branch point, at which antenna signals are separated into a first communication signal and a second communication signal, to a first-communication-signal-line-side band elimination filter and to a second-communication-signal-line-side band elimination filter.

Figure 20:
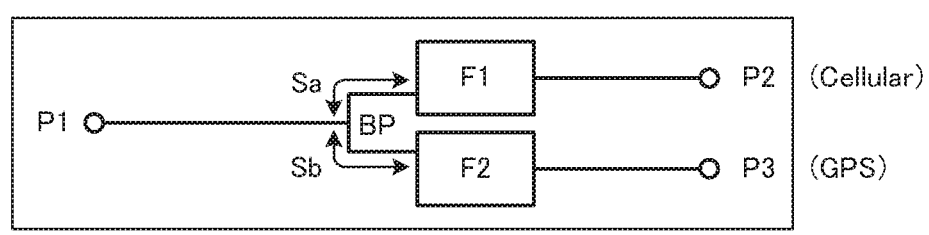
FIG. 20 is a block diagram of a branch circuit 31 including a cellular-signal-line-side band elimination filter F1 and a GPS-signal-line-side band elimination filter F2.

FIG. 20 is a block diagram of a branch circuit 31 including a cellular-signal-line-side band elimination filter F1 and a GPS-signal-line-side band elimination filter F2. An antenna signal line connected to an antenna port P1 is branched at a branch point BP and the branch lines are connected to the filters F1 and F2 with minimum distances. Here, the cellular-signal-line-side band elimination filter F1 eliminates a GPS signal (1.5 GHz) and allows a cellular signal (800 MHz band and 2.2 GHz band) to pass therethrough. The GPS-signal-line-side band elimination filter F2 eliminates a cellular signal (800 MHz band and 2.2 GHz band) and allows a GPS signal (1.5 GHz) to pass therethrough.

Figure 21A:
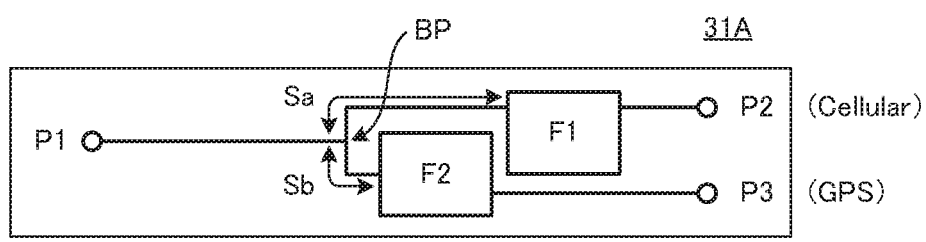
FIG. 21A and FIG. 21B are diagrams illustrating examples in which signal path lengths from the branch point BP to the two filters F1 and F2 are different.
Figure 21B:
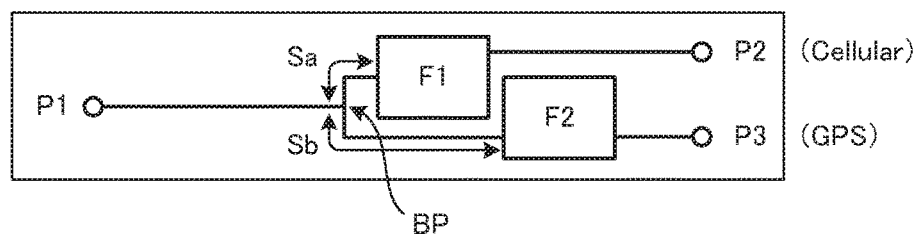

Ideally, it is preferable that the branch point BP be connected to the two filters F1 and F2 with minimum distances. However, in the case where the branch cable defining the branch circuit 31 cannot be widened and the two filters F1 and F2 cannot be arranged side by side, the two filters F1 and F2 are arranged in a longitudinal direction, as illustrated in FIG. 21A and FIG. 21B. With an arrangement illustrated in FIG. 21A, a path length Sa from the branch point BP to the filter F1 is larger than a path length Sb from the branch point BP to the filter F2. With an arrangement illustrated in FIG. 21B, the path length Sa from the branch point BP to the filter F1 is smaller than the path length Sb from the branch point BP to the filter F2.

Figure 22A:
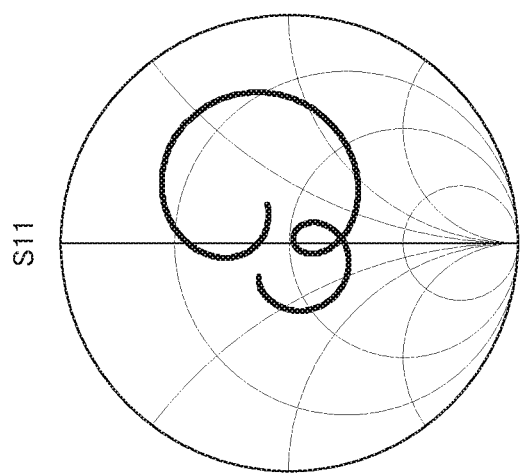
FIG. 22A is a diagram in which the impedance locus of the branch circuit illustrated in FIG. 21A seen from the connection port P1 is represented on the Smith chart.
Figure 22B:
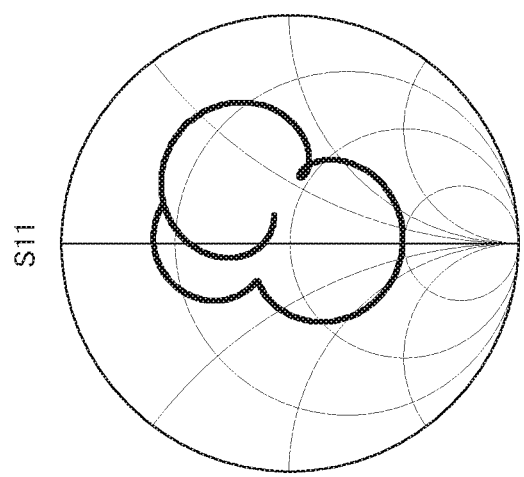
FIG. 22B is a diagram in which the impedance locus of the branch circuit illustrated in FIG. 21B seen from the connection port P1 is represented on the Smith chart.

FIG. 22A is a diagram in which an impedance locus of the branch circuit illustrated in FIG. 21A seen from the connection port P1 is represented on the Smith chart. FIG. 22B is a diagram in which an impedance locus of the branch circuit illustrated in FIG. 21B seen from the connection port P1 is represented on the Smith chart. The sweeping range is from 700 MHz to 2.7 GHz in both cases.

As illustrated in FIG. 22B, when the path length Sb from the branch point BP to the filter F2 becomes large, reflection is increased in a frequency range (frequency band of a cellular signal) higher than the pass band of the filter F2 due to the influence of an inductance component (stray inductance) generated in the path.

Figure 23A:
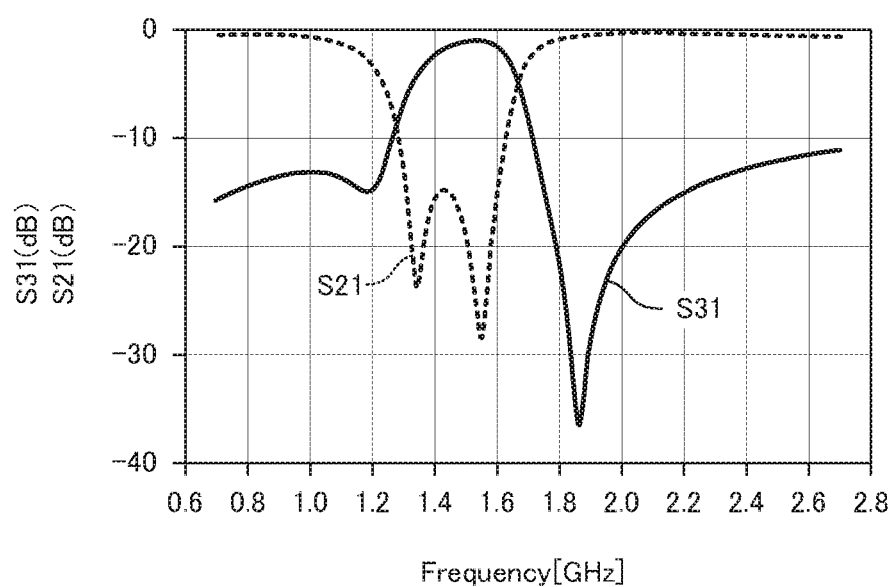
FIG. 23A is a diagram illustrating respective frequency characteristics of the insertion loss S21 between the antenna port P1 and the cellular signal port P2 and the insertion loss S31 between the antenna port P1 and the GPS signal port P3, in the branch circuit illustrated in FIG. 21A.
Figure 23B:
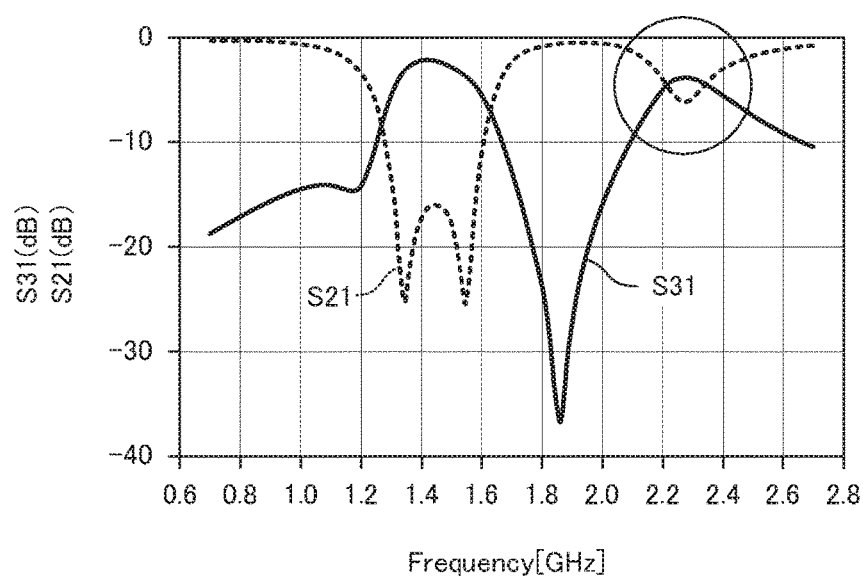
FIG. 23B is a diagram illustrating respective frequency characteristics of the insertion loss S21 between the antenna port P1 and the cellular signal port P2 and the insertion loss S31 between the antenna port P1 and the GPS signal port P3, in the branch circuit illustrated in FIG. 21B.

FIG. 23A is a diagram illustrating respective frequency characteristics of the insertion loss S21 between the antenna port P1 and the cellular signal port P2 and the insertion loss S31 between the antenna port P1 and the GPS signal port P3, in the branch circuit illustrated in FIG. 21A. FIG. 23B is a diagram illustrating respective frequency characteristics of the insertion loss S21 between the antenna port P1 and the cellular signal port P2 and the insertion loss S31 between the antenna port P1 and the GPS signal port P3, in the branch circuit illustrated in FIG. 21B.

The larger the path length Sb from the branch point BP to the GPS-signal-line-side band elimination filter F2, the larger the inductance component generated on the path. When this inductance component increases to a certain extent, a pass range is generated (a circle in FIG. 22B) also in a frequency band of 2.2 GHz which is higher than the original pass band of 1.5 GHz of the GPS-signal-line-side band elimination filter F2, as illustrated in FIG. 23B. When this pass range coincides with or neighbors the pass band of the filter F1 (cellular signal), a cellular signal to be reflected is allowed to propagate on the GPS line, such that the cellular side characteristics are degraded, as illustrated in FIG. 23B.

On the other hand, when the path length Sb from the branch point BP to the GPS-signal-line-side band elimination filter F2 is shortened, as illustrated in FIG. 21A, the inductance component generated by this path length is small and, hence, the undesired pass range described above is not generated within the frequency band being used. As a result of the path length Sa from the branch point BP to the cellular-signal-line-side band elimination filter F1 being large, the inductance generated by the path length Sa is large. However, a pass range is generated only in a frequency band higher than the original pass band 2.2 GHz of the cellular-signal-line-side band elimination filter F1 and, hence, there is no unfavorable influence on the frequency band being used.

In other words, the path length from the branch point BP of the signal line (GPS signal line) on the low pass band frequency side is made to be smaller than the path length from the branch point BP of the signal line (cellular signal line) on the high pass band frequency side. As a result, undesired transmission characteristics are not generated within the frequency band being used.

Figure 24:
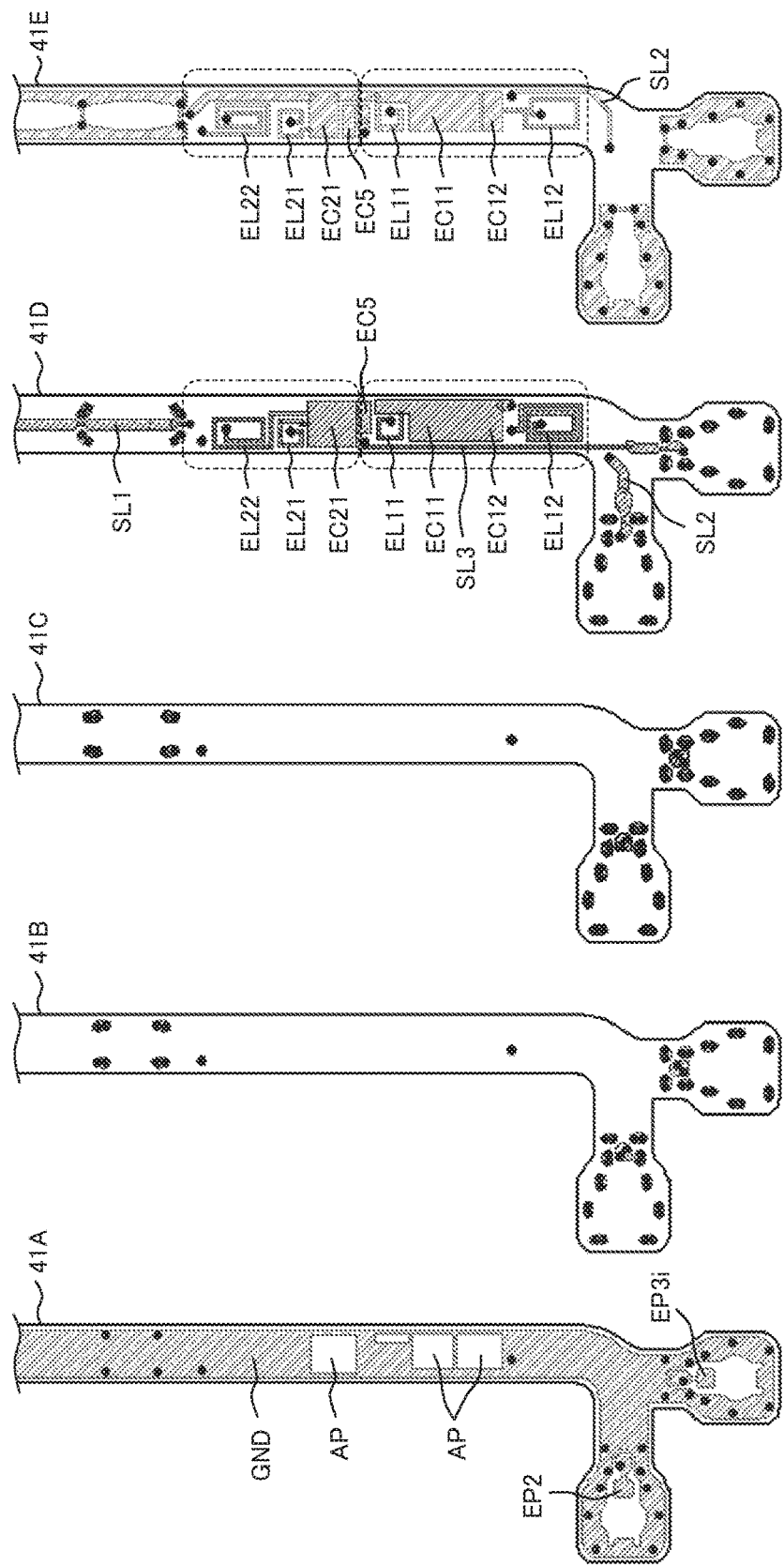
FIG. 24 is an exploded plan view of electrode patterns, illustrated in sequence, provided on the respective layers of dielectric element bodies of the branch cable according to a ninth preferred embodiment of the present invention.
Figure 25:
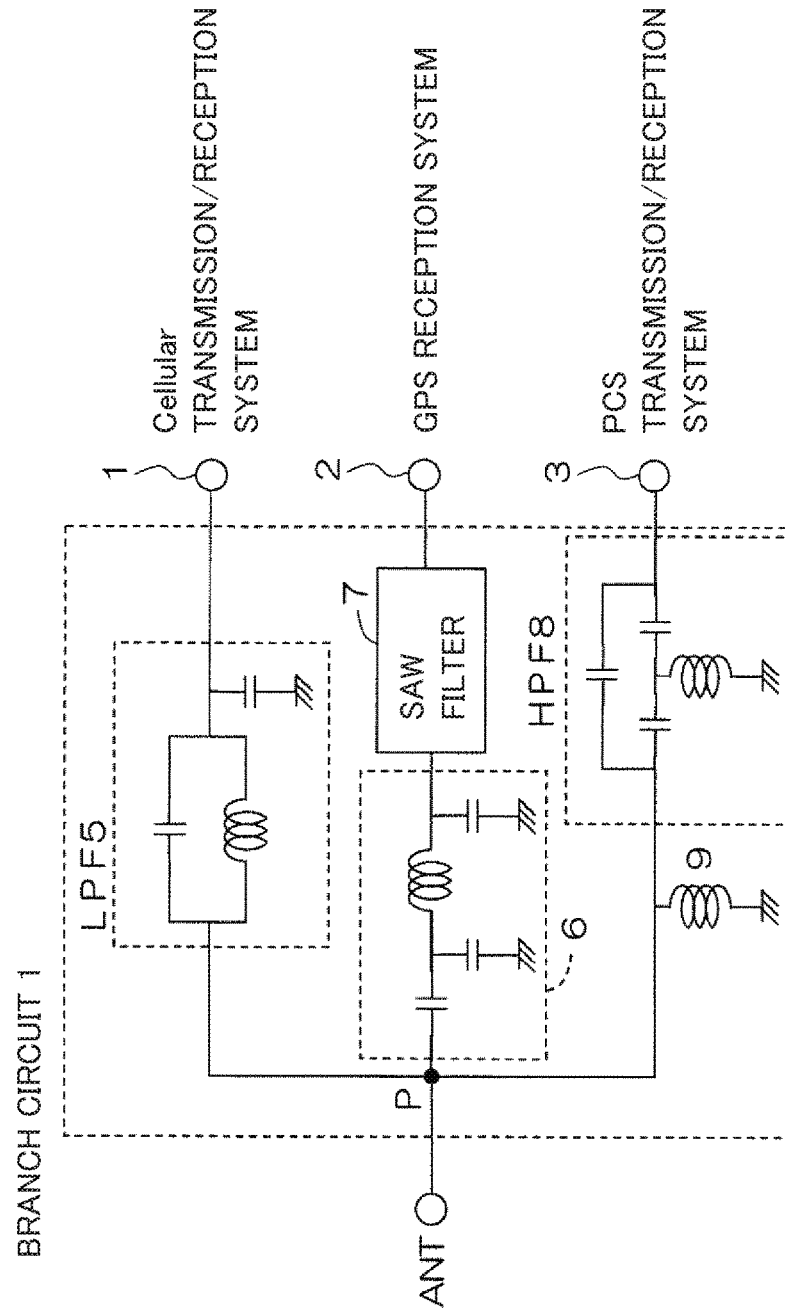
FIG. 25 is a circuit diagram of a branch circuit disclosed in Japanese Unexamined Patent Application Publication No. 2005-184773.
Figure 26:
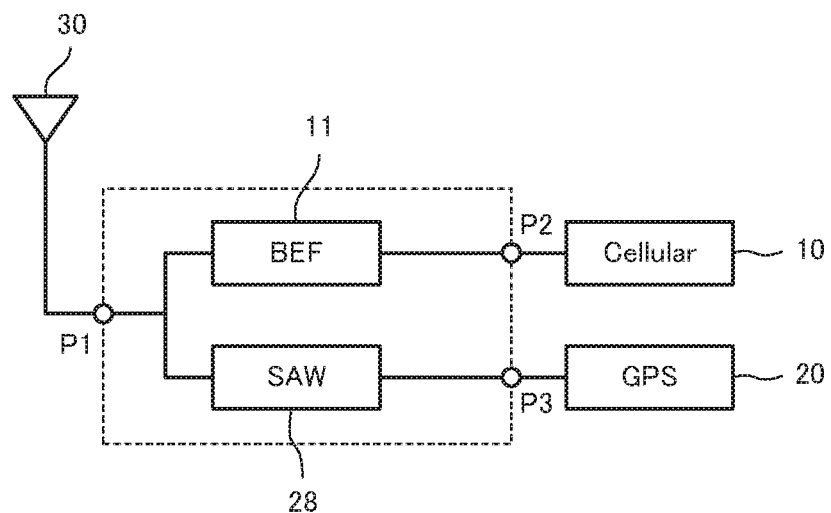
FIG. 26 is a block diagram of a related art branch circuit that separates a communication signal, which includes a high-band communication signal and a low-band communication signal, and a GPS signal in an intermediate frequency band located between the respective bands of the high-band communication signal and the low-band communication signal.
Figure 27A:
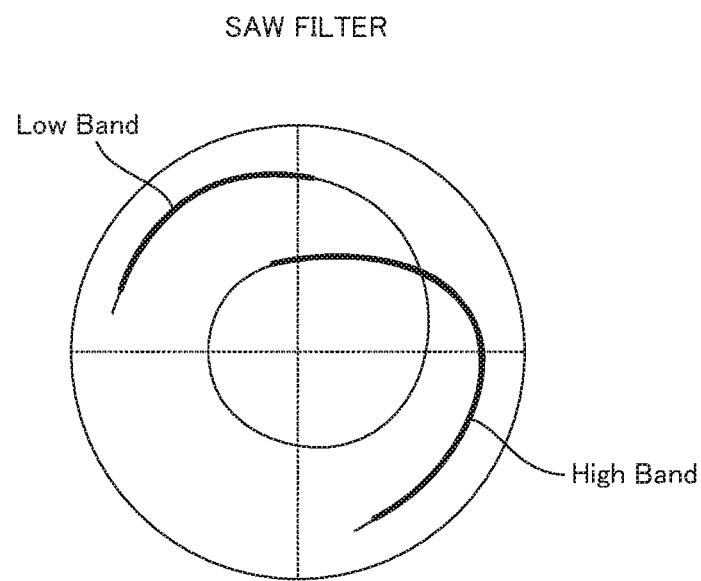
FIG. 27A illustrates the impedance locus of a SAW filter 28 seen from a connection port P1 of an antenna 30 and FIG. 27B illustrates the impedance locus of a band elimination filter 11 seen from the connection port P1 of the antenna 30.
Figure 27B:
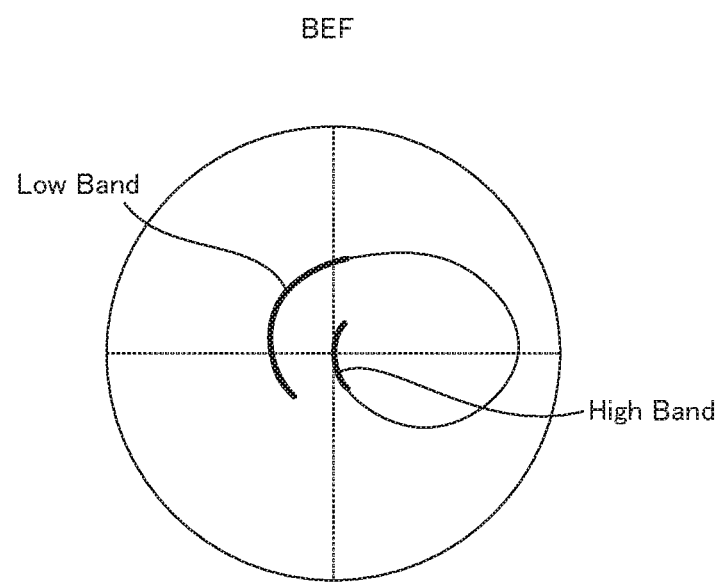
Figure 28:
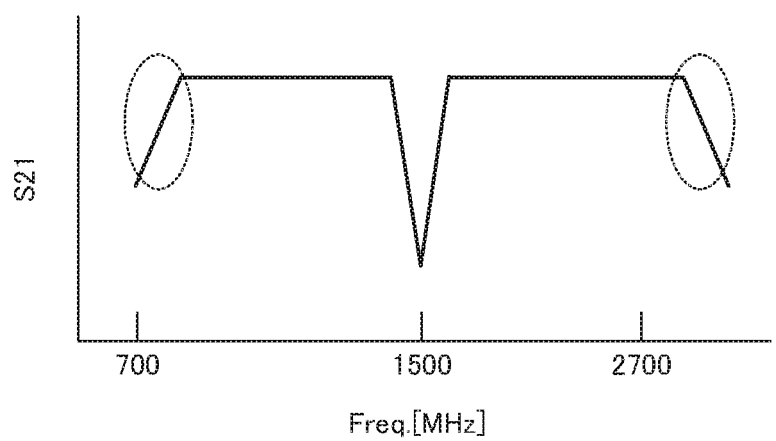
FIG. 28 illustrates the frequency characteristics of an insertion loss (S21 of S-parameters) between the connection port P1 of the antenna 30 and an output port P2 of the band elimination filter 11.

Next, a branch cable in which the branch circuit according to the ninth preferred embodiment is provided will be described. The external perspective view of this branch cable is the same as that illustrated in FIG. 19. FIG. 24 is an exploded plan view of electrode patterns, illustrated in sequence, provided on the respective layers of dielectric element bodies of the branch cable according to the ninth preferred embodiment. Note that an antenna port is outside of the figure and only a portion of a signal conductor connected to the antenna port is illustrated. The configuration of the antenna port portion is preferably the same as that illustrated in FIG. 17.

A first layer 41A is the uppermost layer and a fifth layer 41E is the lowermost layer. Electrodes EP2 and EP3$i$ corresponding to ports P2 and P3$i$ are provided on the first layer 41A. Further, a ground conductor GND is provided. Electrodes EC11, EC12, EC21, and EC5 corresponding to the capacitors C11, C12, C21, and C5 are provided on a fourth layer 41D and a fifth layer 41E. Further, electrodes EL11, EL12, EL21, and EL22 corresponding to the inductors L11, L12, L21, and L22 are provided on the fourth layer 41D and the fifth layer 41E. A capacitor C22 is provided between the ground conductor GND of the first layer 41A and the electrodes EC5 and EC21. Cut-out portions (portions without electrodes) AP are provided in the ground conductor GND of the first layer 41A so as to prevent a large capacitance from being generated between the electrode EC11 and the ground conductor GND of the first layer 41A. Similarly, a cut-out portion (portion without an electrode) AP is provided in the ground conductor GND of the first layer 41A so as to prevent a large capacitance from being generated between the electrode EC21 and the ground conductor GND of the first layer 41A.

Signal conductors (line electrodes) SL1, SL2 and SL3 are provided on the fourth layer 41D, and a ground conductor GND is provided on the fifth layer 41E. A tri-plate strip line structure is defined by the signal conductors SL1, SL2 and SL3 and the ground conductors GND of the first layer 41A and the fifth layer 41E.

Via electrodes for interlayer connection are provided in the layers 41A to 41E. Specifically, via conductors configured to perform interlayer connection of the ground conductors GND and via conductors configured to perform interlayer connection of the electrodes EP2 and EP3*i* are provided in the second layer 41B and the third layer 41C.

The coaxial connectors CC2 and CC3 are mounted on the electrodes EP2 and EP3*i* illustrated in FIG. 19.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer body in which a plurality of layers are stacked, the multilayer body comprising:
    a dielectric element body having flexibility and including:
        a signal conductor;
        a first ground conductor;
        a second ground conductor; and
        an electrode;
    a first communication signal line including the signal conductor, the first ground conductor, and the second ground conductor and allowing a first communication signal to propagate through the first communication signal line; and
    a first filter provided on the first communication signal line and allowing the first communication signal to pass through the first filter; wherein
    the first communication signal line includes at least a portion in which the first ground conductor and the second ground conductor face each other across the signal conductor, the portion defining a tri-plate strip line;
    the first filter includes an inductor and a capacitor;
    the electrode includes a plurality of inductor-defining electrodes and a capacitor-defining electrode;
    the inductor includes the plurality of inductor-defining electrodes;
    the capacitor includes the capacitor-defining electrode;
    the plurality of inductor-defining electrodes overlap the second ground conductor and do not overlap the first ground conductor in a plan view; and
    of the plurality of inductor-defining electrodes, an inductor-defining electrode that is farthest from the second ground conductor in a stacking direction of the plurality of layers is arranged on a same layer of the plurality of layers as the first ground conductor.

2. The multilayer body according to claim 1, wherein the first ground conductor includes an opening configured so that a portion of the first ground conductor does not overlap the signal conductor in a plan view, the opening including no conductors.

3. The multilayer body according to claim 1, wherein the first filter includes a parallel circuit including the inductor and the capacitor and being connected in series with the first communication signal line.

4. The multilayer body according to claim 1, wherein the first filter includes filters arranged in a multiple-stage configuration.

5. The multilayer body according to claim 4, wherein
    the filters arranged in the multiple-stage configuration include band pass filters arranged in a two-stage configuration, the band pass filters each including the inductor and the capacitor; and
    the band pass filters arranged in the two-stage configuration are coupled to each other through magnetic coupling between inductors.

6. The multilayer body according to claim 1, wherein the first communication signal line includes a phase adjustment device.

7. The multilayer body according to claim 6, wherein the phase adjustment device includes the electrode including the plurality of inductor-defining electrodes and the capacitor-defining electrode.

8. The multilayer body according to claim 1, wherein the dielectric element body is a cable having an elongated shape.

9. A communication apparatus comprising:
    a casing; and
    a multilayer body in which a plurality of layers are stacked, the multilayer body being arranged in the casing and comprising:
        a dielectric element body having flexibility and including:
            a signal conductor;
            a first ground conductor;
            a second ground conductor; and
            an electrode;
        a first communication signal line including the signal conductor, the first ground conductor, and the second ground conductor and allowing a first communication signal to propagate through the first communication signal line; and
        a first filter provided on the first communication signal line and allowing the first communication signal to pass through the first filter; wherein
    the first communication signal line includes at least a portion in which the first ground conductor and the second ground conductor face each other across the signal conductor, the portion defining a tri-plate strip line;
    the first filter includes an inductor and a capacitor;
    the electrode includes a plurality of inductor-defining electrodes and a capacitor-defining electrode;
    the inductor includes the plurality of inductor-defining electrodes;
    the capacitor includes the capacitor-defining electrode;
    the plurality of inductor-defining electrodes overlap the second ground conductor and do not overlap the first ground conductor in a plan view; and
    of the plurality of inductor-defining electrodes, an inductor-defining electrode that is farthest from the second ground conductor in a stacking direction of the plurality of layers is arranged on a same layer of the plurality of layers as the first ground conductor.

10. The communication apparatus according to claim 9, wherein the first ground conductor includes an opening configured so that a portion of the first ground conductor does not overlap the signal conductor in a plan view, the opening including no conductors.

11. The communication apparatus according to claim 9, wherein the first filter includes a parallel circuit including the inductor and the capacitor and being connected in series with the first communication signal line.

12. The communication apparatus according to claim 9, wherein the first filter includes filters arranged in a multiple-stage configuration.

13. The communication apparatus according to claim 12, wherein
    the filters arranged in the multiple-stage configuration include band pass filters arranged in a two-stage configuration, the band pass filters each including the inductor and the capacitor; and the band pass filters arranged in the two-stage configuration are coupled to each other through magnetic coupling between inductors.

14. The communication apparatus according to claim 9, wherein the first communication signal line includes a phase adjustment device.

15. The communication apparatus according to claim 14, wherein the phase adjustment device includes the electrode including the plurality of inductor-defining electrodes and the capacitor-defining electrode.

16. The communication apparatus according to claim 9, wherein the dielectric element body is a cable having an elongated shape.

* * * * *